United States Patent
Kumano et al.

(10) Patent No.: US 11,908,526 B2
(45) Date of Patent: Feb. 20, 2024

(54) MEMORY SYSTEM AND METHOD OF CONTROLLING SEMICONDUCTOR MEMORY DEVICE

(71) Applicant: Kioxia Corporation, Tokyo (JP)

(72) Inventors: Naoto Kumano, Yokohama Kanagawa (JP); Kenji Sakurada, Yamato Kanagawa (JP)

(73) Assignee: Kioxia Corporation, Tokyo (JP)

( * ) Notice: Subject to any disclaimer, the term of this patent is extended or adjusted under 35 U.S.C. 154(b) by 195 days.

(21) Appl. No.: 17/589,365

(22) Filed: Jan. 31, 2022

(65) Prior Publication Data
US 2023/0045340 A1    Feb. 9, 2023

(30) Foreign Application Priority Data
Aug. 5, 2021   (JP) ................. 2021-129061

(51) Int. Cl.
  G11C 16/26   (2006.01)
  G11C 16/04   (2006.01)
  G06F 11/10   (2006.01)
  H10B 69/00   (2023.01)

(52) U.S. Cl.
  CPC .......... *G11C 16/26* (2013.01); *G06F 11/1004* (2013.01); *G11C 16/0483* (2013.01); *H10B 69/00* (2023.02)

(58) Field of Classification Search
  CPC . G11C 16/26; G11C 16/0483; G06F 11/1004; H10B 69/00
  See application file for complete search history.

(56) References Cited

U.S. PATENT DOCUMENTS

| | | | |
|---|---|---|---|
| 10,545,819 B1 | 1/2020 | Lu | |
| 10,763,898 B2 * | 9/2020 | Haga | ................... H03M 13/458 |
| 2014/0223263 A1 | 8/2014 | Sakurada et al. | |
| 2016/0011970 A1 | 1/2016 | Sakurada | |
| 2018/0074894 A1 | 3/2018 | Sakurada | |
| 2018/0076832 A1 | 3/2018 | Haga | |
| 2021/0035631 A1 | 2/2021 | Parthasarathy et al. | |

FOREIGN PATENT DOCUMENTS

JP    2018-045387 A    3/2018

* cited by examiner

*Primary Examiner* — Son L Mai
(74) *Attorney, Agent, or Firm* — Allen & Overy LLP

(57) ABSTRACT

According to one embodiment, a memory system includes first and second memory cells and a controller. The controller obtains first and second data based on a first read operation from the first and second memory cells, respectively. The controller obtains third and fourth data based on a second read from the first and second memory cells, respectively. The second read operation is different from the first read operation in a read voltage. The controller sets first and second values indicating likelihood of data stored in the first and second memory cells, respectively, based on information indicating locations of the first and second memory cells. The controller performs error correction on data read from the first and second memory cells using at least the third data and the first value, and using at least fourth data and the second value, respectively.

20 Claims, 22 Drawing Sheets

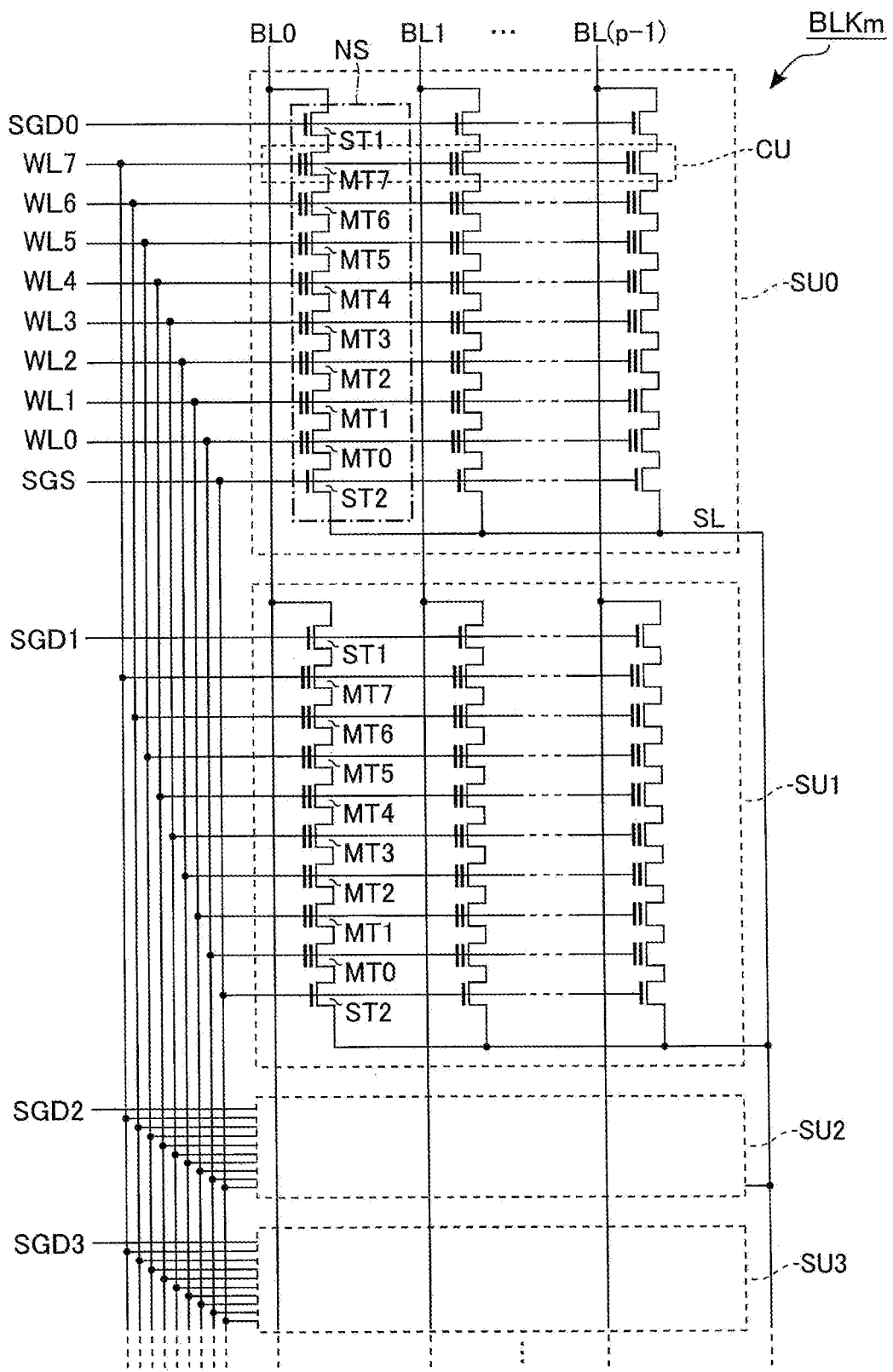
F I G. 3

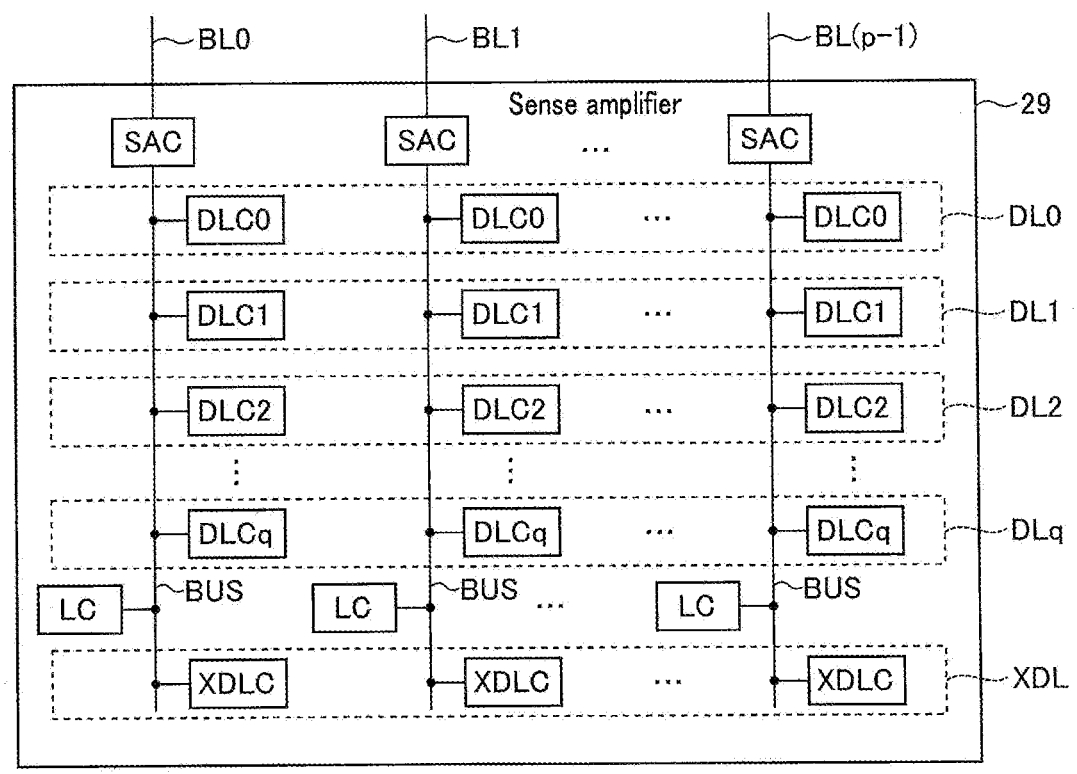
F I G. 5

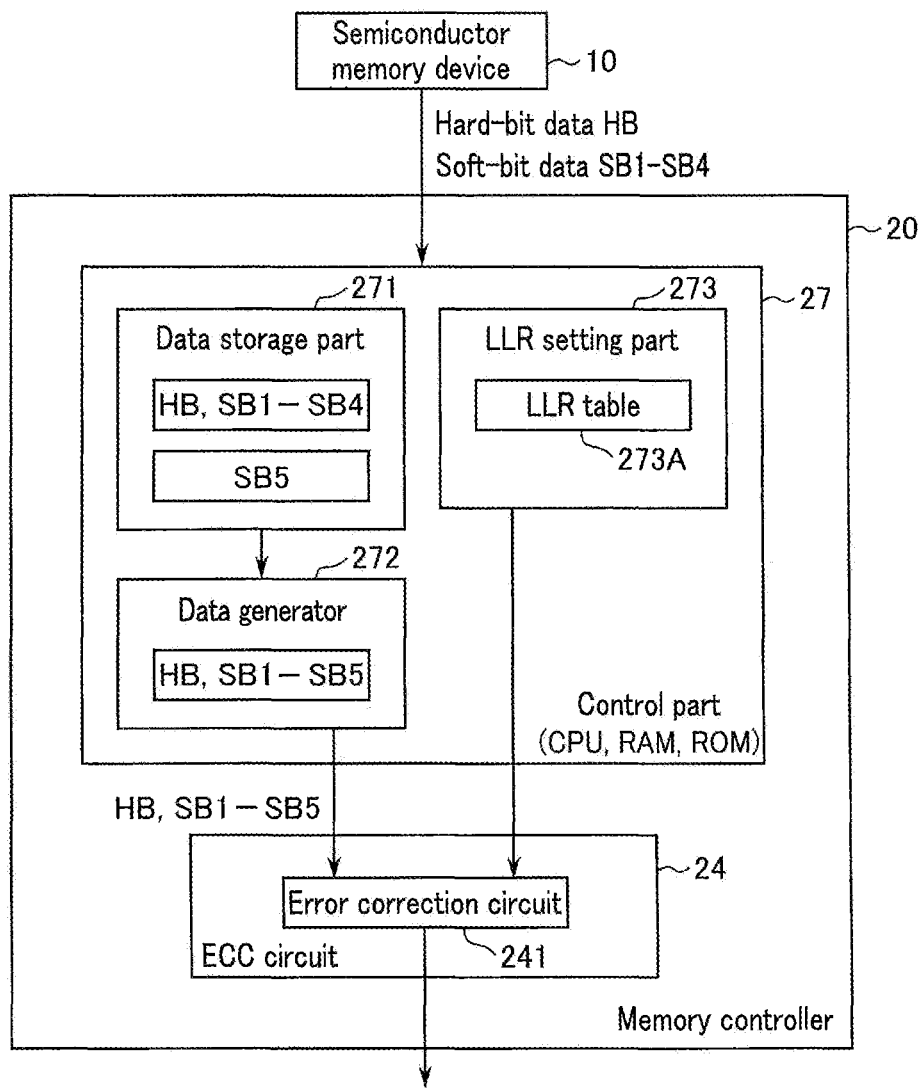
F I G. 6

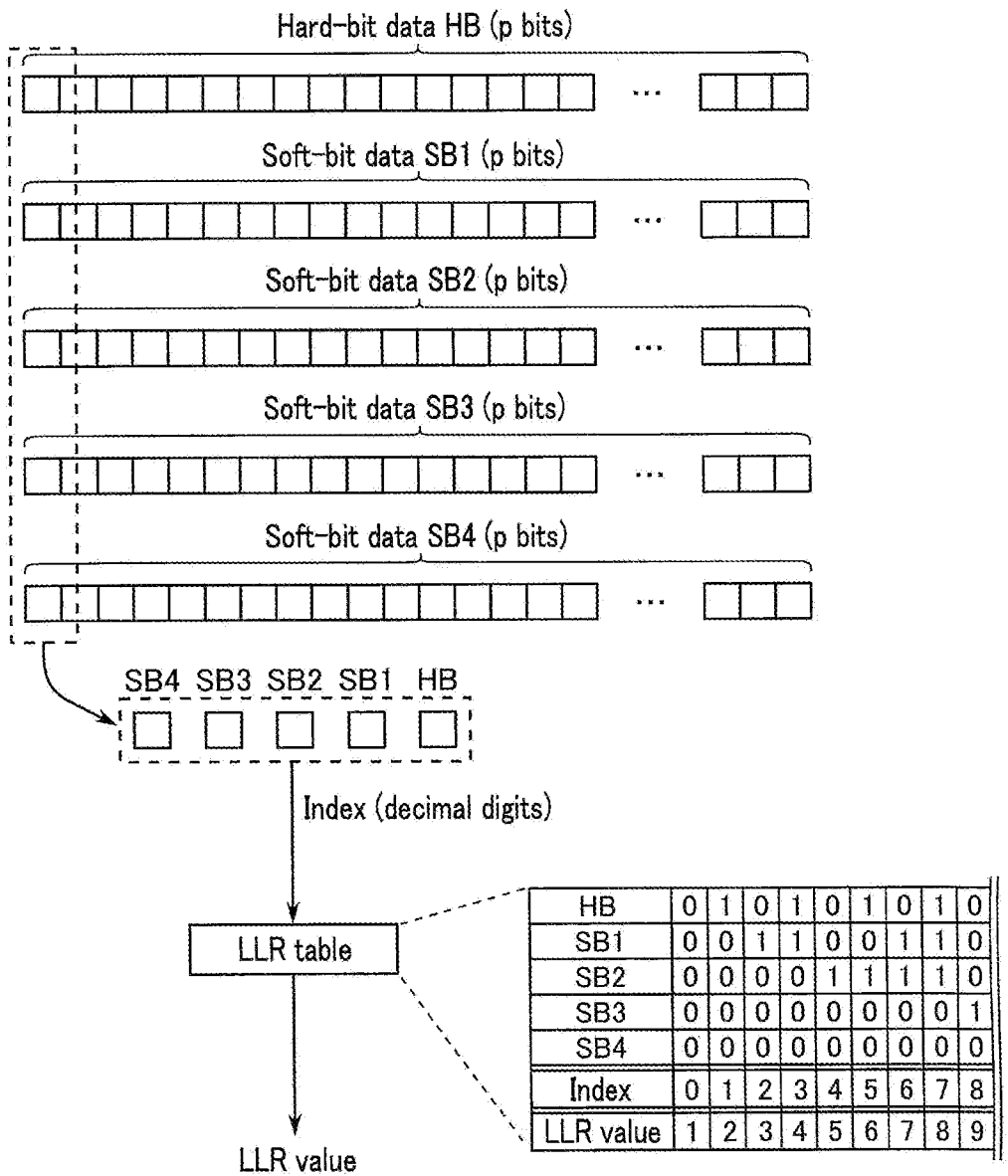
F I G. 7

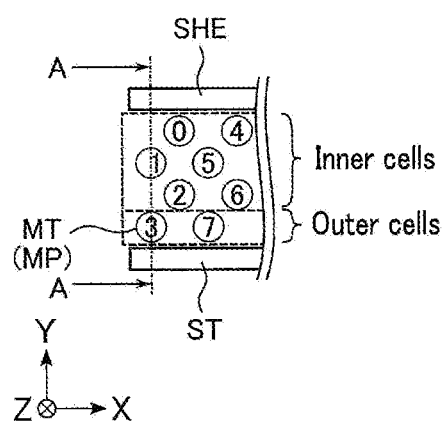
F I G. 8

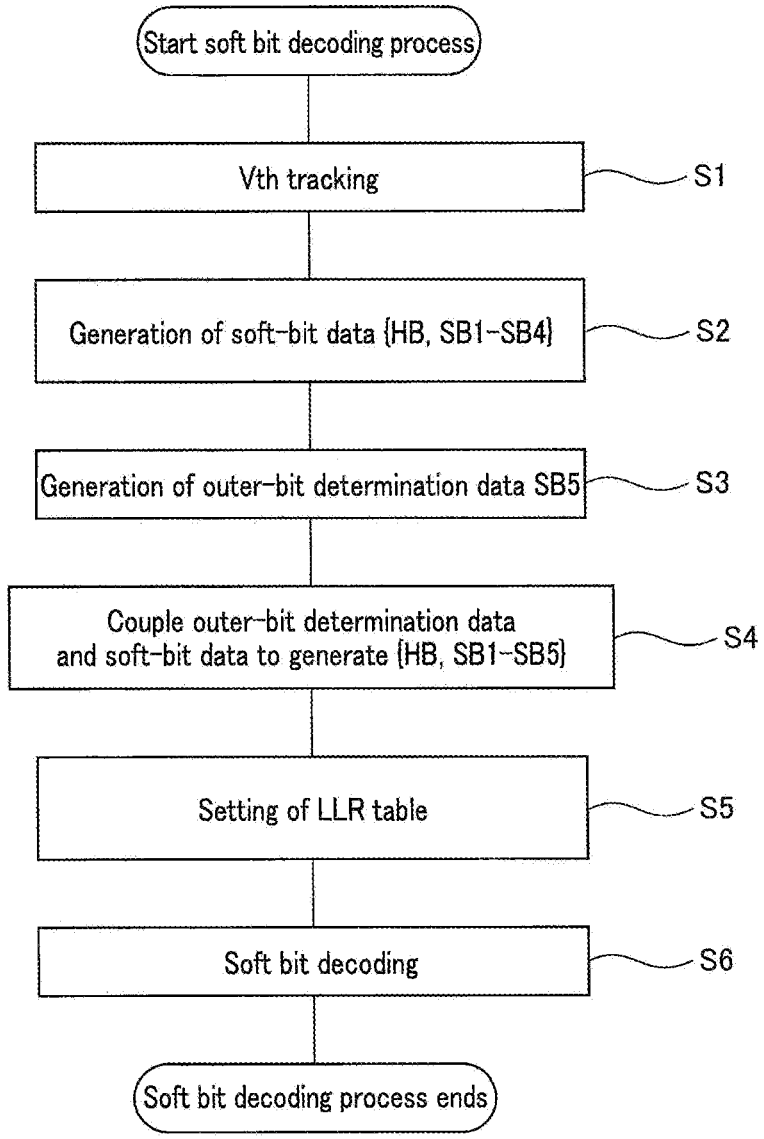
F I G. 10

| byte | IO [hex] | bit | | | | | | | |
|------|----------|-----|---|---|---|---|---|---|---|
| | | IO[bit] | | | | | | | |
| | | 7 | 6 | 5 | 4 | 3 | 2 | 1 | 0 |
| B0 | 88h | 1 | 0 | 0 | 0 | 1 | 0 | 0 | 0 |
| B1 | 88h | 1 | 0 | 0 | 0 | 1 | 0 | 0 | 0 |
| B2 | 88h | 1 | 0 | 0 | 0 | 1 | 0 | 0 | 0 |
| B3 | 88h | 1 | 0 | 0 | 0 | 1 | 0 | 0 | 0 |
| B4580 | 88h | 1 | 0 | 0 | 0 | 1 | 0 | 0 | 0 |
| B4581 | 88h | 1 | 0 | 0 | 0 | 1 | 0 | 0 | 0 |
| B4582 | 88h | 1 | 0 | 0 | 0 | 1 | 0 | 0 | 0 |
| B4583 | 88h | 1 | 0 | 0 | 0 | 1 | 0 | 0 | 0 |

SB read data / Outer determination data (upper table — LLR for inner bits)

| | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|
| HB | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | |
| SB1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | |
| SB2 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | |
| SB3 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | |
| SB4 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | |
| SB5 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | |
| Index | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | |
| LLR value | 1 | 2 | 3 | 4 | 5 | 6 | 7 | 8 | 9 | -9 | -8 | -7 | -6 | -5 | -4 | -3 | -2 | -1 | 1 | 2 | 3 | 4 | 5 | 6 | 7 | 8 | 9 | -9 | -8 | -7 | -4 | -5 | |
| LLR section | LLR valid for inner bits | | | | | | | | | | | | | | | | | | | | | | | | | | | LLR invalid for inner bits | | | | | |

SB read data / Outer determination data (lower table — LLR for outer bits)

| | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|
| HB | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | |
| SB1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | |
| SB2 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | |
| SB3 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | |
| SB4 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | |
| SB5 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | |
| Index | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | |
| LLR value | -1 | -2 | -3 | 3 | 4 | 5 | 6 | 7 | 8 | 9 | -9 | -8 | -7 | -6 | -5 | -4 | -5 | -6 | -7 | -8 | -9 | 1 | 2 | 1 | 4 | 2 | 6 | 7 | 8 | 9 | -9 | -8 | |
| LLR section | LLR valid for outer bits | | | | | | | | | | | | | | | | | | | | | | | | | | | LLR invalid for outer bits | | | | | |

FIG. 13

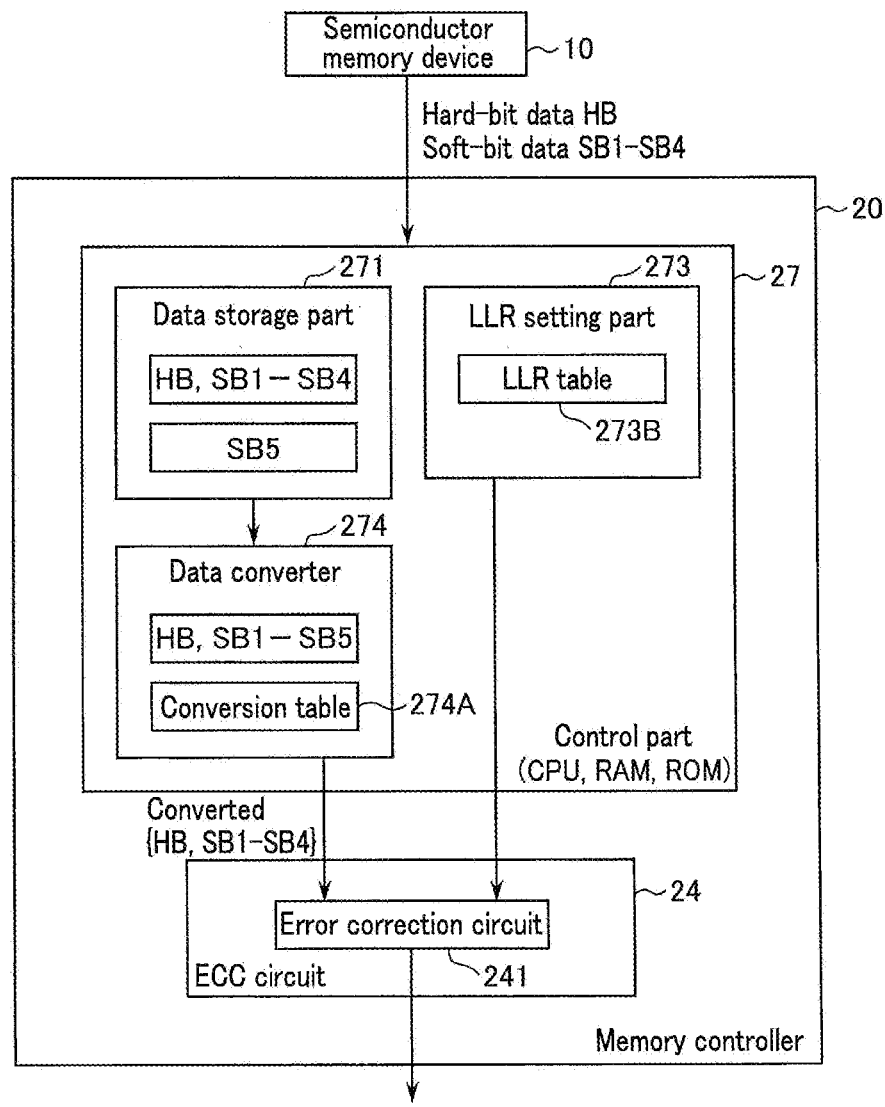
F I G. 15

| Input data (index of {HB, SB1-SB5}) | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Output data (index of converted {HB, SB1-SB4}) | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 0 | 1 | 2 | 3 | 4 | 5 |
| | Common to inner/outer bits | | | | | | | | | | | | | | | | | | | | | Inner bits | | | | | Common to inner /outer bits | | | | | |

| 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 26 | 27 | 28 | 29 | 30 | 31 | 0 | 1 | 2 | 3 | 4 | 5 |
| Common to inner/outer bits | | | | | | | | | | | | | | | | | | | | Outer bits | | | | | | Common to inner /outer bits | | | | | |

FIG. 17

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| HB | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| SB1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 |
| SB2 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 |
| SB3 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| SB4 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| Index | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| LLR value | 1 | 2 | 3 | 4 | 5 | 6 | 7 | 8 | 9 | −1 | −2 | −3 | −4 | −5 | −6 | −7 | −8 | −9 | 1 | 2 | 2 | 5 | −1 | −3 | 2 | 5 | −3 | −2 | 2 | 1 | 1 | −1 |

"SB read data" labels the HB/SB1–SB4 block.

LLR section:
- Indices 0–17: Common LLR valid for inner/outer bits
- Indices 18–25: LLR valid for inner bits
- Indices 26–31: LLR valid for outer bits

F I G. 18

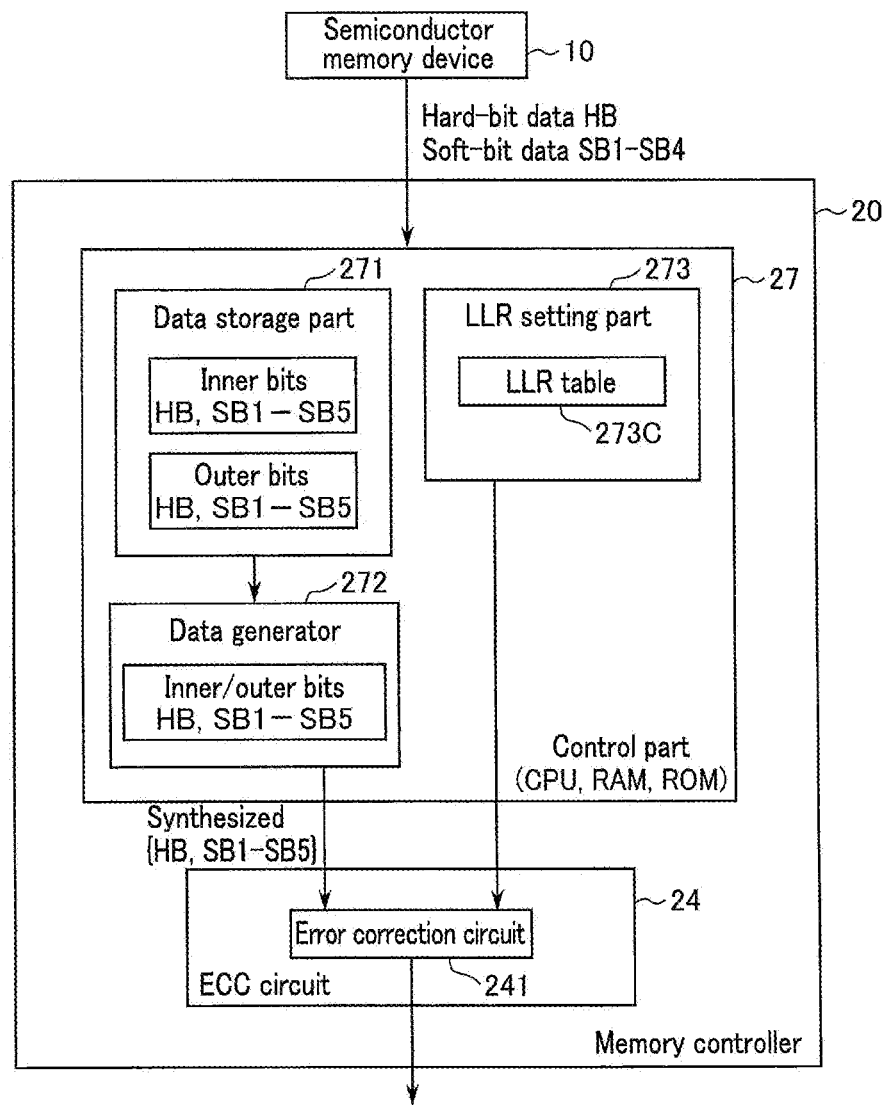
F I G. 19

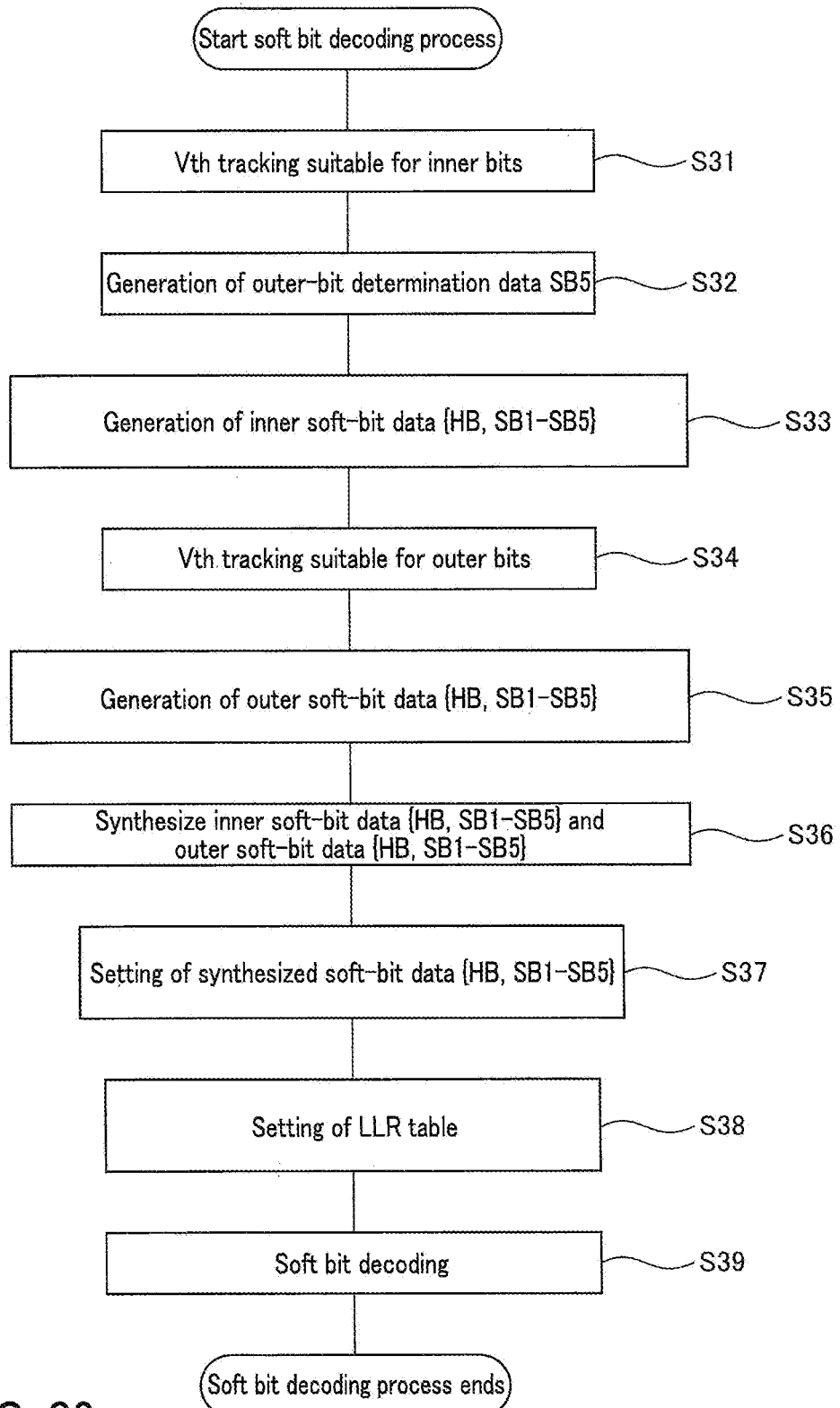
F I G. 20

(a) Inner soft-bit data (HB, SB1-SB5)

| Cell ID | Index | Inner/outer |
|---|---|---|
| 0 | 31 | Inner |
| 1 | 16 | Inner |
| 2 | 10 | Inner |
| 3 | 52 | Outer |
| 36670 | 6 | Inner |
| 36671 | 43 | Outer |

(b) Outer soft-bit data (HB, SB1-SB5)

| Cell ID | Index | Inner/outer |
|---|---|---|
| 0 | 20 | Inner |
| 1 | 16 | Inner |
| 2 | 6 | Inner |
| 3 | 38 | Outer |
| 36670 | 8 | Inner |
| 36671 | 60 | Outer |

Synthesis (c) Synthesized soft-bit data (HB, SB1-SB5)

| Cell ID | Index | Inner/outer |
|---|---|---|
| 0 | 31 | Inner |
| 1 | 16 | Inner |
| 2 | 10 | Inner |
| 3 | 38 | Outer |
| 36670 | 6 | Inner |
| 36671 | 60 | Outer |

F I G. 21

FIG. 22

MEMORY SYSTEM AND METHOD OF CONTROLLING SEMICONDUCTOR MEMORY DEVICE

CROSS-REFERENCE TO RELATED APPLICATIONS

This application is based upon and claims the benefit of priority from Japanese Patent Application No. 2021-129061, filed Aug. 5, 2021, the entire contents of which are incorporated herein by reference.

FIELD

Embodiments described herein relate generally to a memory system and a control method of a semiconductor memory device.

BACKGROUND

As a non-volatile semiconductor memory device, for example, a NAND flash memory, in which memory cells are two-dimensionally or three-dimensionally arranged, is known. A NAND flash memory and a controller that controls the NAND flash memory form a memory system. As an error correction method when reading data from a semiconductor memory device, soft bit decoding (or soft decision decoding) is known.

BRIEF DESCRIPTION OF THE DRAWINGS

FIG. 3 is a circuit diagram of a block in a memory cell array according to the first embodiment.

FIG. 5 is a diagram showing a configuration of a sense amplifier in the semiconductor memory device according to the first embodiment.

FIG. 6 is a functional block diagram relating to an BCC circuit in a memory controller according to the first embodiment.

FIG. 7 is a diagram showing examples of hard-bit data, soft-bit data, indices, and log likelihood ratio (LLR) values according to the first embodiment.

FIG. 8 is a plan view showing a layout of the memory cell transistors in the memory cell array according to the first embodiment.

FIG. 10 is a flowchart showing processing of soft bit decoding in the memory system according to the first embodiment.

FIG. 12 is a diagram showing outer-bit determination data to determine an outer cell and an inner cell according to the first embodiment.

FIG. 13 is a diagram showing an example of an LLR table used for soft bit decoding according to the first embodiment.

FIG. 15 is a functional block diagram relating to an SCC circuit in a memory controller according to a second embodiment.

FIG. 17 is a diagram showing an example of a conversion table used for converting soft-bit data according to the second embodiment.

FIG. 18 is a diagram showing an example of an LLR table used for soft bit decoding according to the second embodiment.

FIG. 19 is a functional block diagram relating to an ECC circuit in a memory controller according to a third embodiment.

FIG. 20 is a flowchart showing processing of soft bit decoding performed in a memory system according to the third embodiment.

FIG. 21 is a diagram showing examples of soft-bit data of outer bits, soft-bit data of inner bits, and synthesized soft-bit data thereof according to the third embodiment.

FIG. 22 is a diagram showing an example of an LLR table used for soft bit decoding according to the third embodiment.

DETAILED DESCRIPTION

In general, according to one embodiment, a memory system includes a semiconductor memory device and a controller. The semiconductor memory device includes a first memory cell arranged in a first region, and a second memory cell arranged in a second region. The controller is configured to control the semiconductor memory device. The controller is configured to: obtain first data based on a first read operation performed on the first memory cell, and second data based on the first read operation performed on the second memory cell; obtain third data based on a second read operation performed on the first memory cell, and fourth data based on the second read operation performed on the second memory cell, the second read operation being different from the first read operation in a read voltage; set a first value indicating likelihood of data stored in the first memory cell based on first information indicating that the first memory cell is arranged in the first region; in a case where the fourth data is equal to the third data, set a second value different from the first value, the second value indicating likelihood of data stored in the second memory cell based on second information indicating that the second memory cell is arranged in the second region; and perform error correction on data read from the first memory cell using at least the third data and the first value, and perform error correction on data read from the second memory cell using at least fourth data and the second value.

Hereinafter, embodiments will be described with reference to the drawings. In the descriptions below, structural elements having the same functions and configurations will be denoted by the same reference symbols. The embodiments to be described below are shown as an example of a device or a method for embodying the technical idea of the embodiments, and are not intended to limit the material, shape, structure, arrangement, etc. of components to those described below.

Each functional block may be implemented in the form of hardware, computer software, or a combination thereof. The functional blocks are not necessarily categorized as in the examples below. For example, some of the functions may be implemented by a functional block other than the exemplified functional blocks. In addition, the exemplified functional blocks may be further divided into functional sub-blocks.

1. First Embodiment

A memory system according to a first embodiment will be described below.

1.1 Configuration of First Embodiment

1.1.1 Configuration of Memory System

First, a configuration of a memory system according to the first embodiment will be described.

Figure 1:
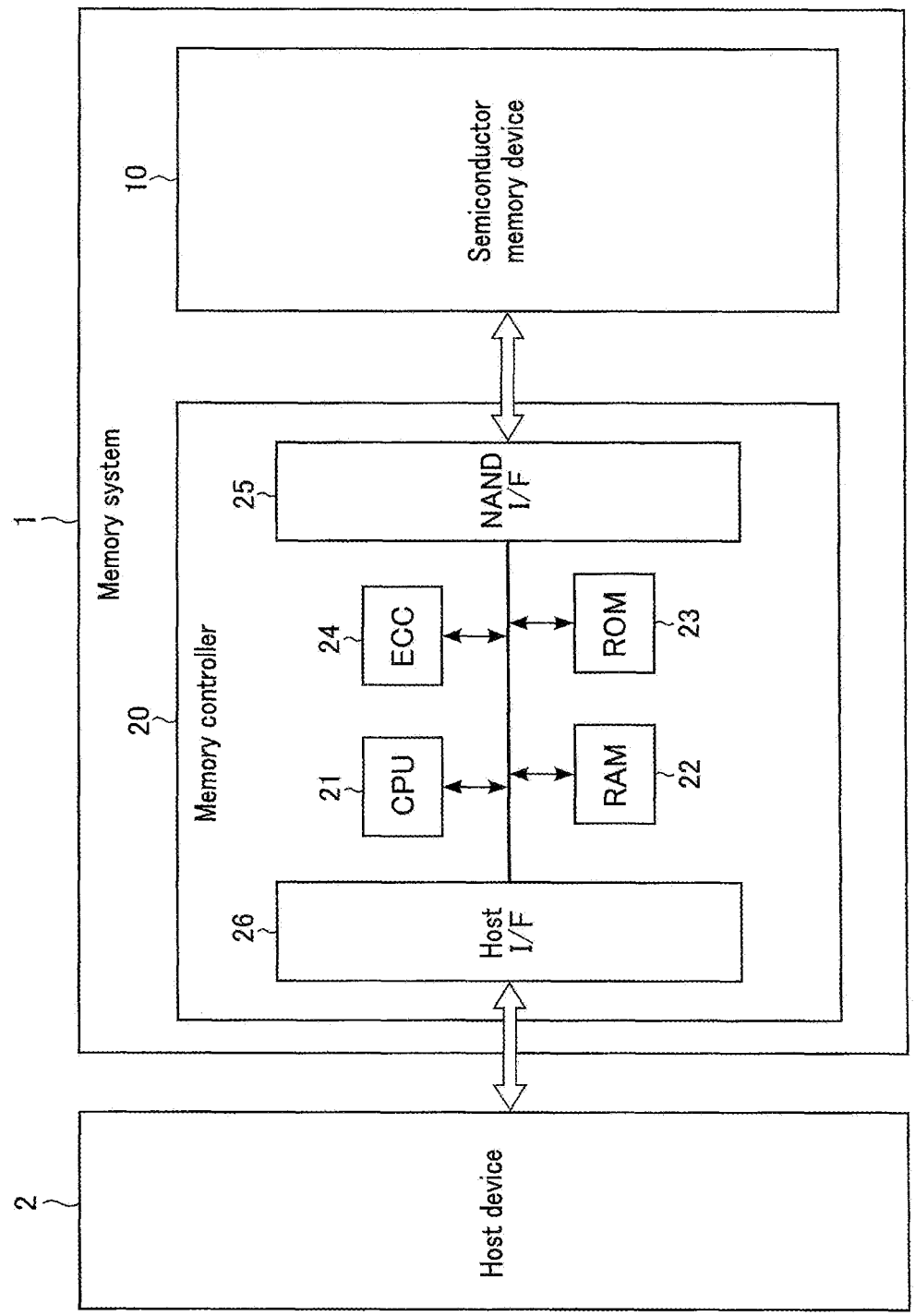
FIG. 1 is a block diagram showing a configuration of a memory system according to a first embodiment, which is connected to a host device.

FIG. 1 is a block diagram showing a configuration of a memory system 1 according to the first embodiment. The memory system 1 includes a semiconductor memory device 10 and a memory controller 20. The memory system 1 may be coupled to an external host device 2 and may execute various operations in response to requests from the host device 2.

Examples of the semiconductor memory device 10 include a NAND flash memory. The semiconductor memory device 10 stores data therein in a non-volatile manner. The semiconductor memory device 10 will be described in detail later.

The memory controller 20 is coupled to the semiconductor memory device 10 via a NAND bus. The memory controller 20 controls the semiconductor memory device 10. The NAND bus performs signal transmission/reception in compliance with a NAND interface standard. The memory controller 20 is also coupled to the host device 2 via a host bus. The memory controller 20 accesses the semiconductor memory device 10 in response to a request received from the host device 2.

Examples of the memory system 1 include a memory card including an SD™ card, a solid state drive (SSD), etc. The semiconductor memory device 10 and the memory controller 20 may form one semiconductor device in combination. Further, the memory controller 20 may be, for example, a system-on-a-chip (SoC).

The host device 2 is, for example, a digital camera, a personal computer, etc. The host bus is a bus that is in compliance with, for example, an SD™ interface standard.

1.1.2 Configuration of Memory Controller

A configuration of the memory controller 20 will be described with reference to FIG. 1. The memory controller 20 includes a central processing unit (CPU) (or a processor) 21, a random access memory (RAM) 22, a read only memory (ROM) 23, an error checking and correcting (ECC) circuit 24, a NAND interface (NAND I/F) circuit 25, and a host interface (host I/F) circuit 26.

The CPU 21 controls the operation of the entire memory controller 20. For example, upon receipt of a write request from the host device 2, the CPU 21 issues, in response thereto, a write command to the NAND interface circuit 25. Similarly, upon receipt of a read request or an erase request as well, the CPU 21 issues, in response thereto, a read command or an erase command to the NAND interface circuit 25, respectively.

In addition, the CPU 21 executes various types of processing such as wear leveling, for managing the semiconductor memory device 10. Functions of the memory controller 20, which will be described below, may be realized by the CPU 21 executing software (e.g., firmware) or may be realized by dedicated hardware.

The RAM 22 is, for example, a semiconductor memory such as a dynamic random access memory (DRAM) or a static random access memory (SRAM). The RAM 22 is used as a work area of the CPU 21. The RAM 22 also temporarily stores firmware, various management tables, data, etc. for managing the semiconductor memory device 10. In the present embodiment, for example, the RAM 22 stores a log likelihood ratio (LLR) table and outer-bit determination data used when performing error correction processing. The LLR table is a table for managing a relationship between each threshold voltage range and an LLR value. Each threshold voltage range is obtained by dividing a threshold voltage distribution of memory cells into a plurality of ranges. The LLR table and the outer-bit determination data will be described later.

The ROM 23, for example, stores firmware to be executed by the CPU 21.

The ECC circuit 24 performs processing for error detection and correction on write data to be written into the semiconductor memory device 10 and read data read from the semiconductor memory device 10. Specifically, the ECC circuit 24 generates redundant data (e.g., parity) to correct errors for the write data to be written into the semiconductor memory device 10. The generated redundant data and the write data are written into the semiconductor memory device 10. Thus, data read from the semiconductor memory device 10 includes the write data and the redundant data (parity) corresponding thereto.

Further, the ECC circuit 24 detects errors in the data read from the semiconductor memory device 10 and, if there are any errors, corrects the errors. The ECC circuit 24 can perform, for example, error correction based on a hard decision such as Bose-Chaudhuri-Hocquenghem (BCH) coding and Reed-Solomon coding, and error correction based on a soft decision such as low-density parity check (LDPC). The ECC circuit 24 will be described in detail later.

The NAND interface circuit 25 is coupled to the semiconductor memory device 10 via the NAND bus, and controls communications with the semiconductor memory device 10. The NAND interface circuit 25 transmits various signals, commands, and data to the semiconductor memory device 10 based on instructions received from the CPU 21. The NAND interface circuit 25 also receives various signals and data from the semiconductor memory device 10.

The host interface circuit 26 is coupled to the host device 2 via the host bus, and controls communications with the host device 2. The host interface circuit 26 transfers requests and data received from the host device 2 to the CPU 21 and the RAM 22, respectively. In response to an instruction from the CPU 21, the host interface circuit 26 transfers data in the RAM 22 to the host device 2.

1.1.3 Configuration of Semiconductor Memory Device

Next, a configuration of the semiconductor memory device 10 will be described. The semiconductor memory device 10 includes, for example, a NAND flash memory capable of storing data in a non-volatile manner.

Figure 2:
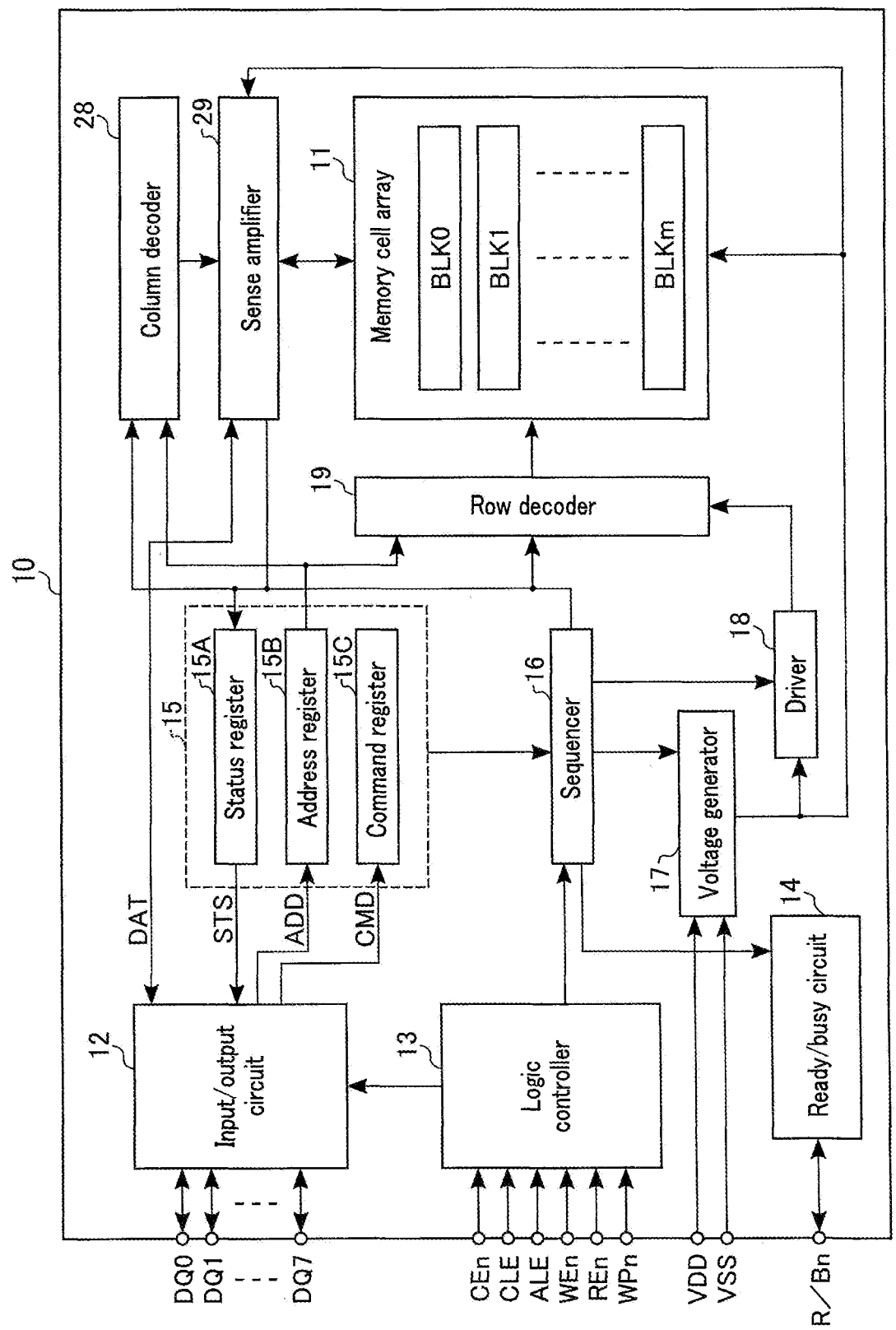
FIG. 2 is a block diagram showing a configuration of a semiconductor memory device according to the first embodiment.

FIG. 2 is a block diagram showing a configuration of the semiconductor memory device 10.

The semiconductor memory device 10 includes a memory cell array 11, an input/output circuit 12, a logic controller 13, a ready/busy circuit 14, a register group 15, a sequencer (or a control circuit) 16, a voltage generator 17, a driver 18, a row decoder 19, a column decoder 28, and a sense amplifier 29. The register group 15 includes a status register 15A, an address register 15B, and a command register 15C.

The memory cell array 11 includes one or more blocks BLK0, BLK1, BLK2, . . . , and BLKm (where m is a natural number of 0 or more). Each of the blocks BLK0 to BLKm includes a plurality of memory cell transistors (hereinafter also referred to as "memory cells") each associated with a row and a column. The memory cell transistors are non-volatile memory cells capable of being electrically erased and programmed. The memory cell array 11 includes a plurality of word lines, a plurality of bit lines, and a source line for applying voltages to the memory cell transistors. A specific configuration of the block BLKm will be described later.

The input/output circuit 12 and the logic controller 13 are coupled to the memory controller 20 via an input/output terminal (and the NAUD bus). The input/output circuit 12 transmits and receives an I/O signal DQ (e.g., DQ0, DQ1, DQ2, . . . , or DQ7) to and from the memory controller 20 via the input/output terminal. The I/O signal DQ transfers a command, an address, data, etc.

The logic controller 13 receives an external control signal from the memory controller 20 via the input/output terminal (and the NAND bus). The external control signal includes, for example, a chip enable signal CEn, a command latch enable signal CLE, an address latch enable signal ALE, a write enable signal WEn, a read enable signal REn, and a write protect signal WPn. The symbol "n" assigned to the name of a signal indicates that the signal is an active-low signal.

The chip enable signal CEn enables selection of the semiconductor memory device 10, and is asserted when selecting the semiconductor memory device 10. The command latch enable signal CLE allows a command transmitted as a signal DQ to be latched in the command register 15C. The address latch enable signal ALE allows an address transmitted as a signal EQ to be latched in the address register 15B. The write enable signal WEn allows data transmitted as a signal DQ to be stored in the input/output circuit 12. The read enable signal REn allows data read from the memory cell array 11 to be output as a signal DQ. The write protect signal WPn is asserted when prohibiting writing and erasing to and from the semiconductor memory device 10.

The ready/busy circuit 14 generates a ready/busy signal R/Bn in response to control by the sequencer 16. The ready/busy signal R/Bn indicates whether the semiconductor memory device 10 is in a ready state or in a busy state. The ready state indicates that the semiconductor memory device 10 can receive a command from the memory controller 20. The busy state indicates that the semiconductor memory device 10 cannot receive a command from the memory controller 20. Through reception of the ready/busy signal R/Bn from the semiconductor memory device 10, the memory controller 20 can recognize whether the semiconductor memory device 10 is in the ready state or in the busy state.

The status register 15A stores status information STS necessary for the operation of the semiconductor memory device 10. The status register 15A transfers the status information STS to the input/output circuit 12 in accordance with an instruction of the sequencer 16.

The address register 15B stores an address ADD transferred from the input/output circuit 12. The address ADD includes a row address and a column address. The row address includes, for example, a block address that designates an operation-targeted block BLKm, and a page address that designates an operation-targeted word line WL in the designated block.

The command register 15C stores a command CMD transferred from the input/output circuit 12. The command CMD includes, for example, a write command that instructs the sequencer 16 to perform a write operation, and a read command that instructs the sequencer 16 to perform a read operation.

For example, an SRAM is used for the status register 15A, the address register 15B, and the command register 15C.

The sequencer 16 receives a command from the command register 15C, and collectively controls the semiconductor memory device 10 in accordance with a sequence based on the received command.

The sequencer 16 controls the row decoder 19, the column decoder 28, the sense amplifier 29, the voltage generator 17, etc., to execute a write operation, a read operation, and an erase operation. Specifically, the sequencer 16 controls the row decoder 19, the driver 18, and the sense amplifier 29 based on a write command received from the command register 15C, and writes data in a plurality of memory cell transistors designated by an address ADD. The sequencer 16 also controls the row decoder 19, the driver 18, the column decoder 28, and the sense amplifier 29 based on a read command received from the command register 15C, and reads data from a plurality of memory cell transistors designated by an address ADD. Also, the sequencer 16 controls the row decoder 19, the driver 18, the column decoder 28, and the sense amplifier 29 based on an erase command received from the command register 15C, and erases data stored in a block designated by an address ADD.

The voltage generator 17 receives a power supply voltage VDD (or VCC, VPP) and a ground voltage VSS via a power supply terminal from outside of the semiconductor memory device 10. The power supply voltage VDD is an external voltage supplied from outside of the semiconductor memory device 10, and is, for example, 3.3 V. The ground voltage VSS is an external voltage supplied from outside of the semiconductor memory device 10, and is, for example, 0 V.

The voltage generator 17 generates a plurality of voltages required for a write operation, a read operation, and an erase operation, using the power supply voltage VDD. The voltage generator 17 supplies the generated voltages to the memory cell array 11, the driver 18, the sense amplifier 29, etc.

The driver 18 receives a plurality of voltages from the voltage generator 17. Of the voltages supplied from the voltage generator 17, the driver 18 supplies a plurality of voltages respectively selected for a read operation, a write operation, and an erase operation to the row decoder 19 via a plurality of signal lines. The driver 18, for example, supplies a read voltage VCGRV and a read-pass voltage VREAD supplied from the voltage generator 17 to a word line in a read operation.

The row decoder 19 receives a row address from the address register 15B, and decodes the received row address. The row decoder 19 selects any one of the blocks based on the result of decoding of the row address, and further selects a word line WL in the selected block BLK. Further, the row decoder 19 transfers the voltages supplied from the driver 18 to the selected block BLK.

The column decoder 28 receives a column address from the address register 15B, and decodes the received column address. The column decoder 28 selects a bit line based on the result of decoding of the column address.

In a data read operation, the sense amplifier 29 detects and amplifies current flowed through a bit line through a memory cell transistor, thereby reading data stored in the memory cell transistor. Further, the sense amplifier 29 temporarily stores read data DAT read from the memory cell transistors, and transfers the read data DAT stored therein to the input/output circuit 12. In a data write operation, the sense amplifier 29 temporarily stores write data DAT transferred from the input/output circuit 12. Further, the sense amplifier 29 applies voltages to a bit line, thereby programming the write data DAT to the memory cell transistor.

1.1.3.1 Configuration of Block

Next, a circuit configuration of the memory cell array 11 in the semiconductor memory device 10 will be described. The memory cell array 11 includes the plurality of blocks BLK0 to BLKm, as described above. In the following, a circuit configuration of the block BLKm will be described.

FIG. 3 is a circuit diagram of the block BLKm in the memory cell array 11. The block BLKm includes, for example, a plurality of string units SU0, SU1, SU2, and SU3. Hereinafter, a "string unit SU" refers to each of the string units SU0 to SU3. The string unit SU includes a plurality of NAND strings (or memory strings) NS.

For simplicity of description, an example in which each NAND string NS includes eight memory cell transistors MT0, MT1, MT2, . . . , and MT7 and two select transistors ST1 and ST2 will be described herein. Hereinafter, a "memory cell transistor MT" refers to each of the memory cell transistors MT0 to MT7.

The memory cell transistor MT includes a control gate and a charge storage layer, and stores data in a non-volatile manner. The memory cell transistors MT0 to MT7 are coupled in series between the source of the select transistor ST1 and the drain of the select transistor ST2. The memory cell transistor MT is capable of storing 1-bit data, or 2 or more-bit data.

The gates of a plurality of select transistors ST1 included in the string unit SU0 are coupled to a select gate line SGD0. Similarly, the gates of the select transistors ST1 in the string units SU1 to SU3 are coupled to respective select gate lines SGD1 to SGD3. The select gate lines SGD0 to SGD3 are independently controlled by the row decoder 19.

The gates of a plurality of select transistors ST2 included in the string unit SU0 are coupled to a select gate line SGS. Similarly, the gates of the select transistors ST2 in the string units SU1 to SU3 are coupled to the select gate line SGS. Individual select gate lines SGS may be coupled to the gates of the select transistors ST2 in the string units SU0 to SU3. The select transistors ST1 and ST2 are used to select a string unit SU in various operations.

The control gates of the memory cell transistors MT0 to MT7 included in the block BLKm are coupled to respective word lines WL0 to WL7. The word lines WL0 to WL7 are independently controlled by the row decoder 19.

Each of the bit lines BL0 to BL(p−1) (p is a natural number of 1 or more) is coupled to the plurality of blocks BLK0 to BLKm, and is coupled to one NAND string NS in the string units SU included in the block BLKm. That is, each of the bit lines BL0 to BL(p−1) is coupled to the drains of the select transistors ST1 of a plurality of NAND strings NS in the same column, of the NAND strings NS arranged in a matrix pattern in the block BLKm. A source line SL is coupled to the blocks BLK0 to BLKm. That is, the source line SL is coupled to the sources of the select transistors ST2 included in the block BLKm.

In short, the string unit SU includes a plurality of NAND strings NS that are coupled to different bit lines BL and coupled to the same select gate line SGD. In addition, the block BLKm includes a plurality of string units SU sharing the word lines WL. Furthermore, the memory cell array 11 includes the blocks BLK0 to BLKm sharing the bit lines BL.

Each block BLK is, for example, a data erase unit. That is, data stored in the memory cell transistors MT included in one block BLK is erased in a batch. Note that, in some embodiments, data may be erased in units of string units SU or in smaller units.

A plurality of memory cell transistors MT that share a word line WL in one string unit SU will be referred to as a "cell unit CU". A set of 1-bit data items respectively stored in the memory cell transistors MT included in the cell unit CU will be referred to as a "page". The storage capacity of the cell unit CU changes in accordance with the number of bits of data stored in one memory cell transistor MT. For example, a cell unit CU stores 1-page data when each memory cell transistor MT stores 1-bit data, stores 2-page data when each memory cell transistor MT stores 2-bit data, and stores 3-page data when each memory cell transistor MT stores 3-bit data.

A write operation and a read operation are performed on the cell unit CU on a page-by-page basis. In other words, a read operation and a write operation are collectively performed or a plurality of memory cell transistors MT coupled to one word line WL provided in one string unit SU.

The string units provided in the block BLKm are not limited to SU0 to SU3, and any number of the string units may be provided in the block BLKm. Note that any number of NAND strings NS may be included in each string unit SU, and any number of memory cell transistors and select transistors may be included in each NAND string NS. Furthermore, each memory cell transistor MT may be a metal-oxide-nitride-oxide-silicon (MONOS) type which uses an insulating film as a charge storage layer, or a floating-gate (FG) type which uses a conductive layer as a charge storage layer.

1.1.3.2 Threshold Voltage Distributions of Memory Cell Transistors

Next, a relationship between data and threshold voltage distributions that may be observed in the memory cell transistors MT will be described.

Figure 4:
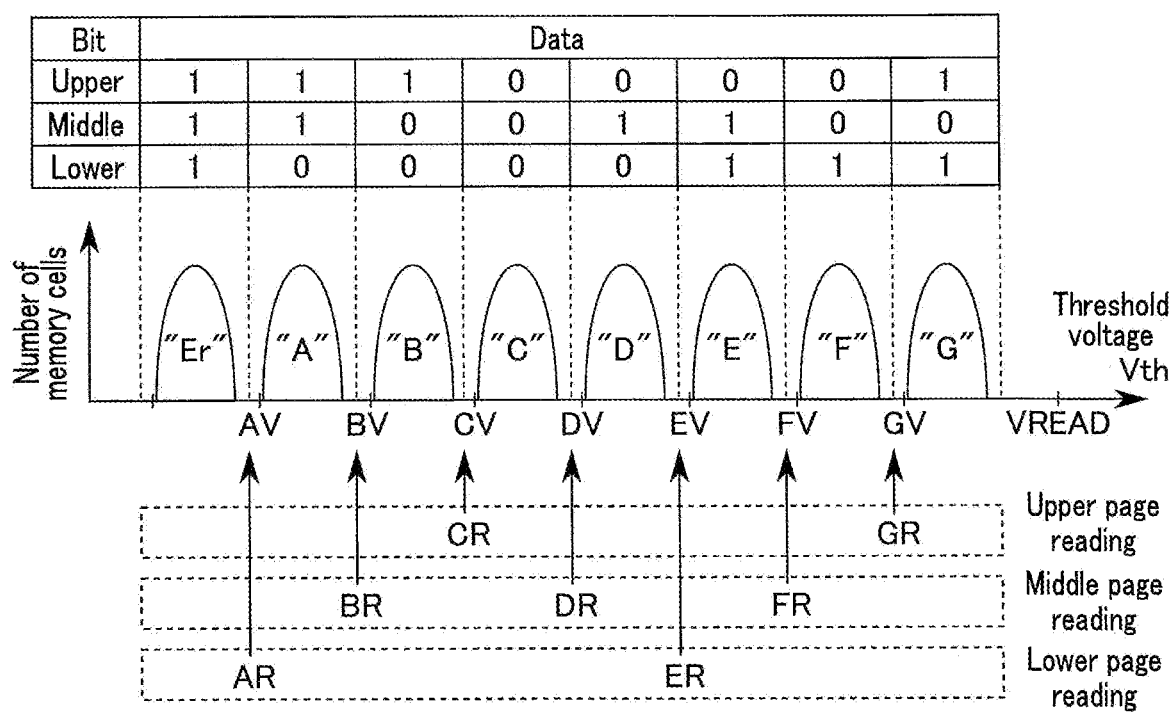
FIG. 4 is a diagram showing a relationship between data and threshold voltage distributions that may be observed in memory cell transistors according to the first embodiment.

FIG. 4 is a diagram showing a relationship between data and threshold voltage distributions that may be observed in the memory cell transistors MT. An example described herein is a case in which a triple-level cell (TLC) method by which 3-bit data can be stored in a single memory cell transistor MT is adopted as a storage method of the memory cell transistors MT. The present embodiment is applicable to cases using other storage methods such as a single-level cell (SLC) method by which 1-bit data can be stored in a single memory cell transistor MT, a multi-level cell (MLC) method by which 2-bit data can be stored in a single memory cell transistor MT, and a quad-level cell (QLC) method by which 4-bit data can be stored in a single memory cell transistor MT.

Here, 3-bit data that a memory cell transistor MT can store is constituted by a lower bit, a middle bit, and an upper bit. In the case of a memory cell transistor MT storing three bits, the memory cell transistor MT may take any one of eight states in accordance with a plurality of threshold voltages. The eight states are referred to as a state "Er", a state "A", a state "B", a state "C", a state "D", a state "E", a state "F", and a state "G" in ascending order from the lowest threshold voltage. The plurality of memory cell transistors MT belonging to each of the states "Er", "A", "B", "C", "D", "E", "F", and "G" form threshold voltage distributions as shown in FIG. 4.

To the states "Er", "A", "B", "C", "D", "E", "F", and "G", for example, 3-bit data "111", "110", "100", "000", "010", "011", "001", and "101" are allocated, respectively. In the notation of the 3-bit data "ZYX", "X" represents a lower bit, "Y" represents a middle bit, and "Z" represents an upper bit. Threshold voltage distributions and data allocation may be set freely.

To read data stored in a read-targeted memory cell transistor MT, a state to which the threshold voltage of the read-targeted memory cell transistor MT belongs is determined. To determine the state, read voltages AR, BR, CR, DR, ER, FR, and GR are used. Hereinafter, a voltage that is applied to a read-targeted memory cell transistor MT for determining the state, including the read voltages AR, BR, CR, DR, ER, FR, and GR, may be referred to as a read voltage VCGRV.

The state "Er" corresponds to, for example, a state in which data has been erased from a memory cell transistor MT (hereinafter also referred to as "an erase state"). The threshold voltages of the memory cell transistors MT which belong to the state "Er" are lower than the voltage AR and have, for example, negative values.

The states "A" to "G" correspond to a state in which a charge is injected into the charge storage layer and data is written into the memory cell transistor MT. The threshold voltages of the memory cell transistors MT which belong to the states "A" to "G" have, for example, positive values. The threshold voltages of the memory cell transistors MT which belong to the state "A" are higher than the read voltage AR and are equal to or lower than the read voltage BR. The threshold voltages of the memory cell transistors MT which belong to the state "B" are higher than the read voltage BR and are equal to or lower than the read voltage CR. The threshold voltages of the memory cell transistors MT which belong to the state "C" are higher than the read voltage CR and are equal to or lower than the read voltage DR. The threshold voltages of the memory cell transistors MT which belong to the state "D" are higher than the read voltage DR and are equal to or lower than the read voltage ER. The threshold voltages of the memory cell transistors MT which belong to the state "E" are higher than the read voltage ER and are equal to or lower than the read voltage FR. The threshold voltages of the memory cell transistors MT which belong to the state "F" are higher than the read voltage FR and are equal to or lower than the read voltage GR. The threshold voltages of the memory cell transistors MT which belong to the state "G" are higher than the read voltage GR and are lower than the read-pass voltage VREAD.

The read-pass voltage VREAD is a voltage which is applied to a word line WL coupled to the memory cell transistors MT when they are not a read target, and is higher than the threshold voltages of the memory cell transistors MT in any of the eight states. Thus, when the read-pass voltage VREAD is applied to the control gate of a memory cell transistor MT, this memory cell transistor MT is turned on regardless of data stored therein.

A verify voltage used in a write operation is set between neighboring threshold voltage distributions. Specifically, verify voltages AV, BV, CV, DV, EV, FV, and GV are respectively set in correspondence with the states "A", "B", "C", "D", "E", "F", and "G". For example, the verify voltages AV, BV, CV, DV, EV, FV, and GV are set to voltages slightly higher than the read voltages AR, BR, CR, DR, ER, FR, and GR, respectively.

As described above, each memory cell transistor MT can belong to any of the eight states, and is capable of storing 3-bit data. Writing and reading are performed on a page-by-page basis in a single cell unit CU. In the case where 3-bit data is stored in each memory cell transistor MT, a group of lower bits, a group of middle bits, and an upper bit in the single cell unit CU are respectively allocated to three pages. The group of lower bits written by one write operation or read by one read operation is referred to as a lower page. The group of middle bits written by one write operation or read by one read operation is referred to as a middle page. The group of upper bite written by one write operation or read by one read operation is referred to as an upper page.

In the case where the data allocation described above is applied, data stored in the lower page is determined by read operations using the read voltages AR and ER. Data stored in the middle page is determined by read operations using the read voltages BR, DR, and FR. Data in the upper page is determined by read operations using the read voltages CR and GR.

1.1.4 Configuration of Sense Amplifier

Next, a configuration of the sense amplifier 29 in the semiconductor memory device 10 will be described.

FIG. 5 is a diagram showing the configuration of the sense amplifier 29 in the semiconductor memory device 10. The sense amplifier 29 includes p sense amplifier circuits SAC, plural data latches DL (e.g., DL0, DL1, DL2, . . . , and DLq (q is a natural number of 0 or more)), p logic circuits LC, and a data latch XDL.

Each data latch DLk (k is 0, 1, . . . , q) includes p data latch circuits DLCk. The data latch XDL includes p data latch circuits XDLC. The data latch circuits DLCk and XDLC temporarily store data.

Each bit line BL is coupled to one sense amplifier circuit SAC, q+1 data latch circuits DLCk, one logic circuit LC, and one data latch circuit XDLC.

During data reading, one of the sense amplifier circuits SAC is electrically coupled to one read-targeted memory cell transistor MT via a bit line BL coupled to that sense amplifier circuit SAC. Thereafter, the sense amplifier circuit SAC senses, on a node thereof, the current flowed through the read-targeted memory cell transister MT, thereby determining whether the threshold voltage of the read-targeted memory cell transistor MT is higher than a read voltage VCGRV applied thereto. Furthermore, based on the result of the sensing, the sense amplifier circuit SAC determines in which one of two states (e.g., on-state or off-state) the read-targeted memory cell transistor MT is. The two states of the memory cell transistor MT correspond to data "0" or data "1". Each sense amplifier circuit SAC stores whether the read data is data "0" or data "1" in any one of the data latch circuits DLCk coupled to that sense amplifier circuit SAC.

Each of the data latch circuits DLCk and XDLC stores data "0" or data "1" obtained under different conditions. For example, the data latch circuit DLC0 of the bit line BL0 stores data "0" or data "1" obtained from a memory cell transistor MT connected to the bit line BL0 by applying a first read voltage VCGRV thereto. The data latch circuit XDLC of the bit line BL0 stores data "0" or data "1" obtained from the memory cell transistor MT connected to the bit line BL0 by applying a second read voltage VCGRV thereto. The first and second read voltages VCGRV differ each other.

Each logic circuit LC may perform logical operations on data in the data latch circuits DLCk and XDLC coupled to that logic circuit LC. For example, the logic circuit LC of the bit line BL0 performs logical operations on data in the data latch circuits DLC0 and XDLC of the bit line BL0. Examples of the logical operations include a NOT operation, an OR operation, an AND operation, an XOR operation, and an XNOR operation.

1.1.5 Configuration of ECC Circuit

Next, the ECC circuit 24 in the memory controller 20 in the first embodiment will be described.

FIG. 6 is a diagram showing a functional block relating to the ECC circuit 24 in the memory controller 20. As shown, the memory controller 20 further includes a control part 27. The control part 27 may be realized by a combination of some of the functions of the CPU 21, RAM 22, and ROM 23.

The control part 27 controls the overall operation of the memory controller 20. The control performed by the control part 27 includes processing related to the operation of the ECC circuit 24. In an attempt to correct errors in data that is read from the semiconductor memory device 10, the control part 27 instructs, via the NAND interface circuit 25, the semiconductor memory device 10 to read data necessary for the error correction. The data necessary for the error correction includes hard-bit data HB and soft-bit data SB.

The control part 27 includes a data storage part 271, a data generator 272, and an LLR setting part 273.

The data storage part 271 is, for example, realized by the function of the RAM 22, and stores hard-bit data HB, soft-bit data SB1 to SB4, and outer-bit determination data SB5.

The hard-bit data HB is data that is read from a read-targeted page (also referred to as "selected page") in a read-targeted cell unit CU (also referred to as "selected cell unit") by lower page reading, middle page reading, or upper page reading. The hard-bit data HB is, for example, one page in size. The hard-bit data HB includes a string of bits (i.e., hard bits) based on a result of reading data from the read-targeted memory cell transistors MT (also referred to as "selected cell transistors") of the selected cell unit CU.

Each of the soft-bit data SB1 to SB4 is, for example, one page in size. Each of the soft-bit data SB1 to SB4 includes a string of soft bits. Each of the soft bits represents information about one selected cell transistor MT. Each of the soft bits includes a result of a logical operation executed on a plurality of bits that are read from the one selected cell transistor MT respectively under different conditions. The soft-bit data SB1 to SB4 includes various types of data depending on the details of the operations.

Here, the data storage part 271 stores the hard-bit data HB and the soft-bit data SB1 to SB4. The hard-bit data HB and the soft-bit data SB1 to SB4 will be described in detail later. Hereinafter, the hard-bit data HB and the soft-bit data SB1 to SB4 are collectively referred to as soft-bit data {HB, SB1-SB4}.

The data storage part 271 also stores the outer-bit determination data SB5. The outer-bit determination data SB5 is, for example, one page in size. The outer-bit determination data SB5 will be described in detail later.

The data generator 272 couples each bit of the outer-bit determination data SB5 to each bit of the soft-bit data {HB, SB1-SB4} to generate data {HB, SB1-SB4, SB5}. Hereinafter, data obtained by coupling the soft-bit data {HB, SB1-SB4} and the outer-bit determination data SB5 will be referred to as soft-bit data {HB, SB1-SB5}.

The LLR setting part 273 may store an LLR table 273A used for soft bit decoding. A combination of a plurality of bits in the soft-bit data {HB, SB1-SB5} that are associated with each other and one LLR value corresponding to that combination are associated in the LLR table 273A. The combination of a plurality of bits will be referred to as an index. Then, a plurality of indices representing different values and a plurality of LLR values corresponding thereto are associated. Each LLR value is information indicating a reliability (or likelihood) of data that is read from a cell transistor MT at a certain read voltage.

Conversion from the indices to the LLR values can be performed using the LLR table 273A, for example. The LLR table 273A may be stored in the memory system 1 in advance, for example, prior to the shipment of the memory system 1 from the factory. Alternatively, the LLR table 273A may be generated by the control part 27 prior to performing the conversion to LLR values.

The ECC circuit 24 includes an error correction circuit 241. The error correction circuit 241 receives the soft-bit data {HB, SB1-SB5} and the LLR table 273A from the control part 27, and performs soft bit decoding. The error correction circuit 241 may perform decoding per data having a size, for example, of a frame.

FIG. 7 shows examples of the hard-bit data HB, four pieces of soft-bit data SB1, SB2, SB3, and SB4, indices, and LLR values. Each square in FIG. 7 shows one bit of the hard-bit data HB or the soft-bit data SB1 to SB4. The squares vertically aligned in FIG. 7 represent bits of a selected cell transistor MT. The hard-bit data HB having a size of one page includes p bits, where the number p equals to the number p of memory cell transistors MT in one cell unit CU. Similarly, each of the soft-bit data SB1 to SB4 includes p bits.

Each of the soft-bit data SB1 to SB4 includes a string of bits (i.e., soft bits) that are obtained based on data read from the memory cell transistors MT of the selected page under different conditions. Each soft bit carries information about one selected cell transistor MT.

For one selected cell transistor MT, a hard bit in the hard-bit data HB and a soft bit in each of the soft-bit data SB1 to SB4 form one set. One set includes 5-bit data, and corresponds to a value of one index. For example, one set that includes a soft bit in SB4, a soft bit in SB3, a soft bit in SB2, a soft bit in SB1, and a hard bit in HB (hereinafter, notated as "{soft bits in SB4 to SB1, a hard bit in HB}") being 00000 corresponds to index 0. Another one set that includes {soft bits in SB4 to SB1, a hard bit in HB} being 00001 corresponds to index 1. Still another one set that includes {soft bits in SB4 to SB1, a hard bit in HB} being 00111 corresponds to index 7.

As described above, each corresponding LLR value can be extracted from each index using the LLR cable 273A. Each LLR value has a positive or negative value. For convenience of understanding, the index and the LLR value are expressed in decimal digits in the drawings as well as in the descriptions below. For example, index 0 corresponds to the LLR value of 1. Index 1 corresponds to the LLR value of 2. Index 7 corresponds to the LLR value of 8.

1.1.4 Structure of Semiconductor Memory Device

Next, an example of the structure of the semiconductor memory device 10 according to the first embodiment will be described.

Figure 9:
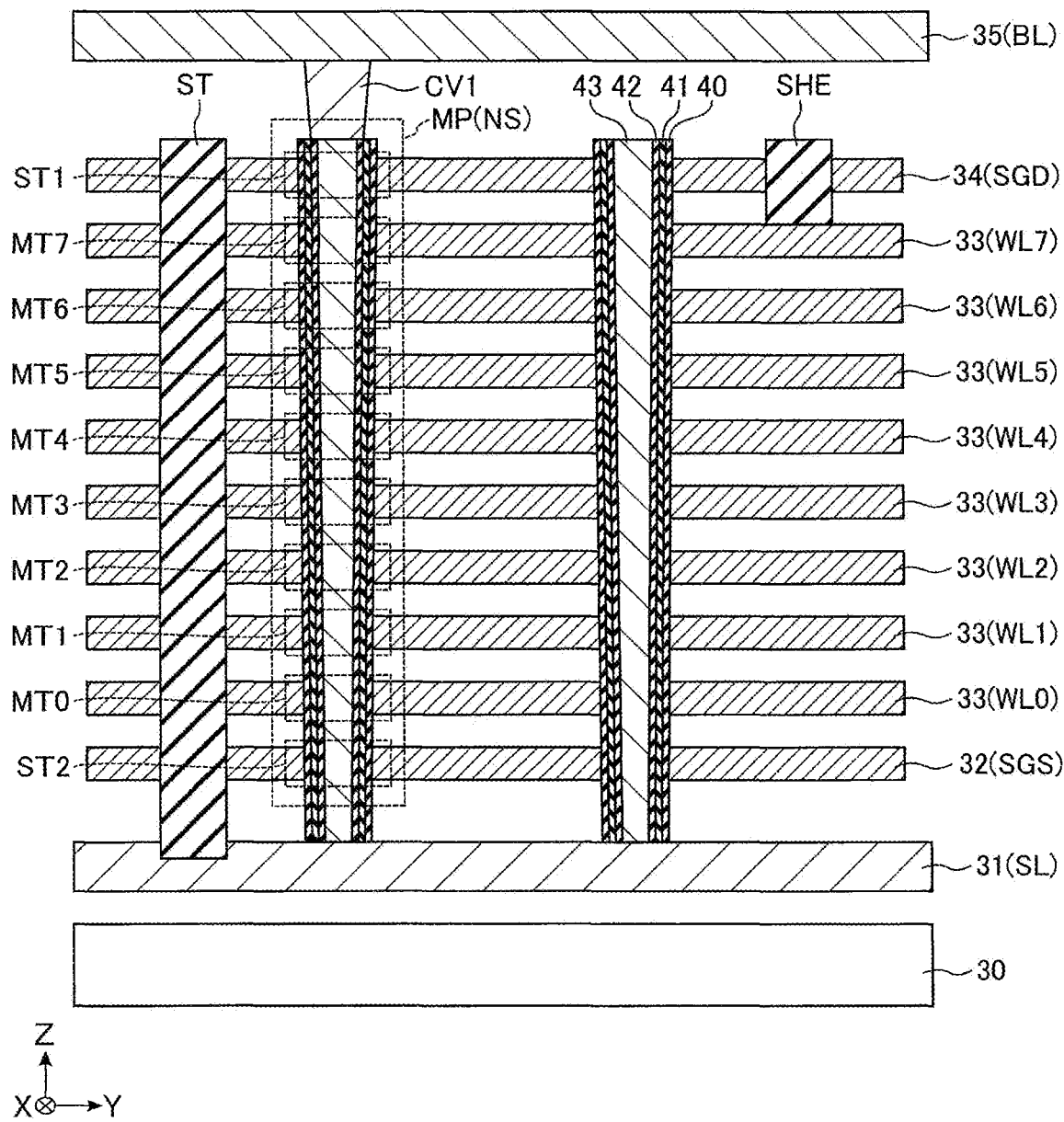
FIG. 9 is a cross-sectional view taken along line A-A in FIG. 8.

FIG. 8 is a plan view showing a layout of a memory pillar MP (or a memory cell transistor MT) in the memory cell array 11 of the semiconductor memory device 10. FIG. 9 is a cross-sectional view taken along line A-A in FIG. 8. In FIGS. 8 and 9, two directions orthogonal to each other and parallel to a surface of a semiconductor substrate 30 are defined as an X direction and a Y direction, and a direction orthogonal to a surface including these X and Y directions (i.e., XY plane) is defined as a Z direction. The X direction corresponds to a direction in which the word lines WL extend, the Y direction corresponds to a direction in which the bit lines BL extend, and the Z direction corresponds to a direction in which the word lines WL are stacked. In FIG. 9, interlayer insulating layers between conductive layers are omitted.

As shown in FIGS. 8 and 9, the memory cell array 11 includes a plurality of memory pillars MP, an insulating layer ST, and an insulating layer SHE. The insulating layer ST extends in the X direction and the Z direction. The insulating layers ST are arranged in the Y direction. The insulating layer SHE extends in the X direction. The insulating layers SHE are arranged in the Y direction. The insulating layers ST and the insulating layers SHE are alternately arranged in the Y direction.

The memory pillars MP are arranged between the insulating layer ST and the insulating layer SHE in the Y direction. The memory pillars MP are, for example, arranged in a staggered manner in the X and Y directions in a region between adjacent insulating layers ST and SHE. The number and arrangement of the memory pillars MP between adjacent insulating layers ST and SHE are not limited thereto, and may be appropriately changed.

In the following, a structure of the memory cell array 11 will be described in detail with reference to the cross-sectional view shown in FIG. 9.

As shown in FIG. 9, the memory cell array 11 includes conductive layers 31 to 34, the memory pillars MP, and a contact plug CV1, which are provided above the semiconductor substrate 30. Specifically, the conductive layer 31 is provided above the semiconductor substrate 30. The conductive layer 31 is formed in a plate shape that is parallel to a main surface (or the XY plane) of the semiconductor substrate 30. This conductive layer 31 functions as the source line SL. The conductive layer 31 includes, for example, polysilicon doped with impurities, or tungsten (W).

Above the conductive layer 31, the insulating layer ST along the XZ plane and the insulating layer SHE extending in the X direction are alternately arranged in the Y direction. A structure above the conductive layer 31 and between adjacent insulating layers ST and SHE, which may be a layer stack, corresponds to, for example, a single string unit SU.

A conductive layer 32, a plurality of conductive layers 33, a conductive layer 34, and a conductive layer 35 are provided, in order from the lower layer, above the conductive layer 31 and between adjacent insulating layers ST and SHE. Of these conductive layers, conductive layers adjacent to each other in the Z direction are stacked with an interlayer insulating film (now shown) interposed therebetween. The conductive layers 32 to 34 are each formed in a plate shape that is parallel to the XY plane. The conductive layer 32 functions as a select gate line SGS. The conductive layers 33 respectively function as, in order from the lower layer, word lines WL0 to WL7. The conductive layer 34 functions as a select gate line SGD0. The conductive layers 32 to 34 include, for example, tungsten (W) or polysilicon.

Each of the memory pillars MP extends through (or penetrates) the layer stack, which locates between the insulating layers ST and SHE, in the Z direction. Each memory pillar HP passes through the conductive layers 34, 33, and 32 from above the conductive layer 34 to reach the upper surface of the conductive layer 31. Each memory pillar MP functions as one NAND string NS.

The memory pillar MP includes, for example, a block insulating layer 40, a charge storage layer 41, a tunnel insulating layer (also referred to as a "tunnel insulating film") 42, and a semiconductor layer 43. Specifically, the block insulating layer 40 is provided on the inner wall of a memory hole for forming the memory pillar MP. The charge storage layer 41 is provided on the inner wall of the block insulating layer 40. The tunnel insulating layer 42 is provided on the inner wall of the charge storage layer 41. The semiconductor layer 43 is provided inside the tunnel insulating layer 42. The memory pillar MP may have a structure in which a core insulating layer is provided inside the semiconductor layer 43.

In the above-described structure of the memory pillar MP, an intersecting portion of the memory pillar MP and the conductive layer 32 functions as a select transistor ST2. Intersecting portions of the memory pillar MP and the conductive layers 33 respectively function as memory cell transistors MT0 to MT7. An intersecting portion of the memory pillar MP and the conductive layer 34 functions as a select transistor ST1.

The semiconductor layer 43 functions as a channel layer of the memory cell transistors MT and the select transistors ST1 and ST2. A current path of a NAND string NS is formed inside the semiconductor layer 43.

The charge storage layer 41 has a function of accumulating a charge injected from the semiconductor layer 43 in the memory cell transistor MT. The charge storage layer 41 includes, for example, a silicon nitride film.

The tunnel insulating layer 42 functions as a potential barrier when a charge is injected from the semiconductor layer 43 into the charge storage layer 41, or when a charge accumulated in the charge storage layer 41 is diffused into the semiconductor layer 43. The tunnel insulating layer 42 includes, for example, a silicon oxide film.

The block insulating layer 40 prevents the charge accumulated in the charge storage layer 41 from diffusing into the conductive layers 33 (i.e., word lines WL). The block insulating layer 40 includes, for example, an aluminum oxide layer, a silicon oxide layer, and a silicon nitride layer.

A plurality of conductive layers 35 are provided above the upper surfaces of the memory pillars MP with an interlayer insulating film (not shown) interposed therebetween. The conductive layers 35 are arranged in the X direction. Each conductive layer 35 is a linear interconnect layer extending in the Y direction, and functions as a bit line BL. Each conductive layer 35 is electrically coupled to one corresponding memory pillar MP in every string unit SU. Specifically, in each string unit SU, a contact plug CV1 is provided on the semiconductor layer 43 in each memory pillar MP, and one conductive layer 35 is provided on the contact plug CV1. The conductive layer 35 includes, for example, aluminum (Al) or tungsten (W). The contact plug CV1 includes a conductive layer of, for example, tungsten (W).

The number of word lines WL and the number of select gate lines SGD and SGS may be changed in accordance with the number of memory cell transistors MT and the number of select transistors ST1 and ST2, respectively.

In the above-described arrangement of the memory cell transistors MT (or the memory pillars MP), as shown in FIG. 8, the memory cell transistors MT are sectioned into outer cells (or outer bits) and inner cells (or inner bits). The outer cells are close to the insulating layer ST in the Y direction, and include a single row of a plurality of memory cell transistors MT arranged in the X direction. The inner cells are the memory cell transistors MT other than the outer cells. That is, the inner cells are close to the insulating layer SHE in the Y direction, and include three rows of a plurality of memory cell transistors MT each arranged in the X direction.

1.2 Operation of First Embodiment

In the following, soft bit decoding (or soft decision decoding) in error correction processing in data reading performed in the memory system 1 will be described.

FIG. 10 is a flowchart showing processing of soft bit decoding in the memory system 1 of the first embodiment. The processing described below is instructed or executed by the memory controller 20.

Figure 11:
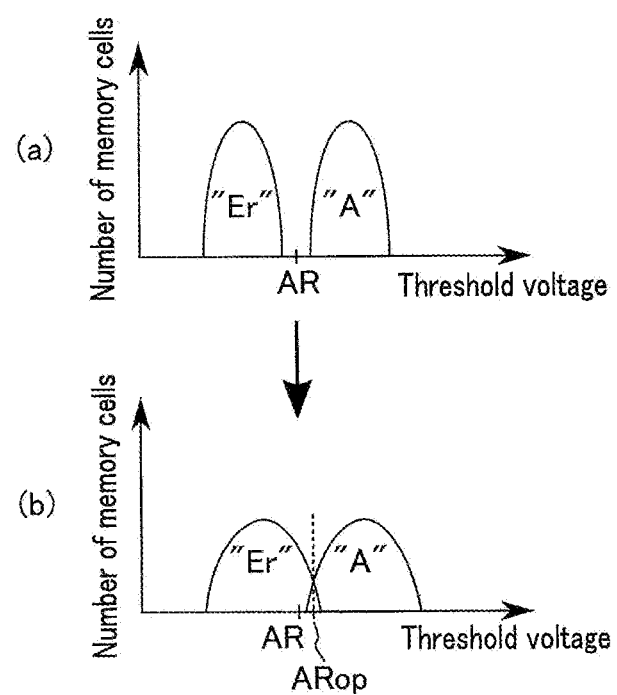
FIG. 11 is a diagram for explaining Vth tracking according to the first embodiment.

First, as shown in FIG. 10, the memory controller 20 performs a read operation (hereinafter, referred to as Vth tracking) of searching for an optimal read voltage by multiple instances of reading (S1). In the Vth tracking, a better voltage value of a read voltage VCGRV used in the read operation is estimated. For example, in a case where data is read from a memory cell transistor by distinguishing its state between the state "Er" and the state "A", threshold voltage distributions of the state "Er" and the state "A" are preferred to be separated as shown in section (a) in FIG. 11. However, in reality, there may be a case where the threshold voltage distributions of the state "Er" and the state "A" intersect with each other as shown in section (b) in FIG. 11. In this case, rather than using the read voltage AR, using a read voltage ARop, which corresponds to the smallest value (e.g., the smallest number of memory cells) in the threshold voltage distribution curve, as shown in the section (b) in FIG. 11, may lead to better reading (in other words, achieving a higher success probability of error correction). Based on this, the memory controller 20 performs Vth tracking to find the smallest value in the threshold voltage distribution curve. In the Vth tracking, data reading is executed repeatedly while changing the level of read voltage VCGRV. As a result of the Vth tracking, the memory controller 20 obtains voltages of a plurality of smallest values (also referred to as "smallest voltages") respectively for the read voltages AR, BR, CR, DR, ER, FR, and (or) GR in the threshold voltage distribution curve. Then, the memory controller 20 estimates optimal read voltages ARop, BRop, CRop, DRop, ERop, FRop, and (or) GRop based on the smallest voltages.

The Vth tracking may be performed to estimate the smallest voltages that are required for reading from a selected page only, or to estimate the smallest voltages that are required for reading from all the pages of the selected cell unit CU. The result of the Vth tracking is, for example, stored in the RAM 22, as, for example, a value shifted from the default read voltage VCGRV. This result may be used when reading data next time from the selected page or selected cell unit CU. The result of the Vth tracking may be, for example, stored for each cell unit CU.

Next, as shown in FIG. 10, the memory controller 20 performs generation of the soft-bit data {HB, SB1-SB4} (S2). The memory controller 20 obtains all the soft-bit data SB1-SB4 that is required for soft bit decoding for the hard-bit data HB of the selected page in accordance with a soft bit decoding method adopted by the error correction circuit 241. That is, the memory controller 20, for example, reads the hard-bit data HB from the semiconductor memory device 10. Furthermore, the memory controller 20 reads the soft-bit data SB1, SB2, SB3, and SB4 from the semiconductor memory device 10. Then, the soft-bit data {HB, SB1-SB4} is stored in the data storage part 271.

The soft-bit data SB1 to SB4 may be obtained in any order. Which of the soft-bit data SB1 to SB4 is required is based on the soft bit decoding method that is adopted by the error correction circuit 241. An example of the soft-bit data SB1 to SB4 will be described later. As a result of obtaining all the necessary soft-bit data SB1 to SB4, the memory controller 20 will obtain p indices respectively for the p selected cell transistors MT.

Next, as shown in FIG. 10, the memory controller 20 performs generation of the outer-bit determination data SB5 (S3). The generated outer-bit determination data SB5 is stored in the data storage part 271. As shown in FIG. 8, the memory cell transistors MT arranged in the semiconductor memory device 10 are sectioned into the outer cells and the inner cells. For example, the outer cells are adjacent to the insulating layer ST, and include a plurality of memory cell transistors arranged in the X direction in a single row. The inner cells are the memory cell transistors other than the outer cells. That is, the inner cells are adjacent to the insulating layer SHE, and include a plurality of memory cell transistors arranged in three rows each in the X direction, and the three rows are arranged in the Y direction.

Section of the outer cells and the inner cells is not limited to the above example. In this example, the outer cells are a plurality of memory cell transistors arranged in the X direction in a single row that are adjacent to the insulating layer ST, but a plurality of memory cell transistors arranged in the X direction in plural rows that are adjacent to the insulating layer ST may be treated as the outer cells.

FIG. 12 is a diagram showing the outer-bit determination data SB5 to determine an outer cell and an inner cell. As described above, the outer-bit determination data SB5 is, for example, one page in size. Here, the size of one page is assumed to be 4584 bytes (4584*8 bits). Herein, the memory cell transistors MT included in one cell unit CU (i.e., 4584*8 memory cell translators) are sectioned per eight memory cell transistors MT into bytes B0, B1, B2, . . . , and B4583, as shown in FIG. 12. The eight memory cell transistors MT included in each of the bytes B0 to B4583 are represented by identifiers (e.g., IO numbers) assigned thereto as shown in FIG. 8.

Of the eight memory cell transistors of IO0 to IO7, outer cells are indicated by "1", and inner cells are indicated by "0". For example, the memory cell transistor of IO3 is indicated by "1", and this memory cell transistor is an outer cell. Similarly, the memory cell transistor of IO7 is indicated by "1", and this memory cell transistor is also an outer cell. On the other hand, the sensory cell transistors other than IO3 and IO7 are indicated by "0", and these memory cell transistors are inner cells. In this way, the memory controller 20 generates the outer-bit determination data SB5 as shown in FIG. 12 depending on whether a memory cell transistor MT is an outer cell or an inner cell.

Next, as shown in FIG. 10, the memory controller 20 performs generation of the soft-bit data {HB, SB1-SB5} that includes the outer-bit determination data SB5 (S4). The memory controller 20 uses the data generator 272 to couple the soft-bit data {HB, SB1-SB4} generated in step S2 and the outer-bit determination data SB5 generated in step S3 to generate the soft-bit data {HB, SB1-SB5}.

Next, the memory controller 20 sets the LLR table 273A in the LLR setting part 273 (S5). The LLR table 273A is used for soft bit decoding in the next step S6. The LLR table 273A sections LLR values of the outer bits and the inner bits.

FIG. 13 is a diagram showing an example of the LLR table 273A used for soft bit decoding. In the LLR table 273A, indices obtained from the soft-bit data {HB, SB1-SB5} and the LLR values are associated. Similar to the above description made with respect to FIG. 7, one set that includes {soft bits in SB5 to SB1, a hard bit in HB} being 000000 corresponds to index 0. Another one set that includes {soft bits in SB5 to SB1, a hard bit in HB} being 000001 corresponds to index 1. Still another one set that includes {soft bits in SB5 to SB1, a hard bit in HB} being 100111 corresponds to index 39. LLR values of indices 0 to 25 are LLR values that are valid for the inner bits. LLR values of indices 26 to 31 are LLR values that are invalid for the inner bits. Furthermore, LLR values of indices 32 to 57 are LLR values that are valid for the outer bits. LLR values of indices 58 to 63 are LLR values that are invalid for the outer bits. Note that the indices corresponding to the invalid LLR values are thought to be obtained from a memory cell transistor MT only in a limited situation. Examples of such a situation include unexpectedly large noise, and a defect of the memory cell transistor MT.

By using the LLR table 273A, it is possible to obtain LLR values according to characteristics of the respective threshold voltage distributions of the outer bits and the inner bits. For example, index 9 that corresponds to {soft bite in SB5 to SB1, a hard bit in HB} being 001001 is associated with the LLR value of 1. On the other hand, index 41 that corresponds to {soft bits in SB5 to SB1, a hard bit in HB} being 101001 is associated with the LLR value of −1. Further, index 1 that corresponds to {soft bits in SB5 to SB1, a hard bit in HB} being 000001 is associated with the LLR value of 2. On the other hand, index 33 that corresponds to {soft bits in SB5 to SB1, a hard bit in HB} being 100001 is associated with the LLR value of −2. That is, even when the threshold voltage of two memory cell transistors MT are same, which results in the same value of the soft bits in SB4 to SB1 and hard bit in HB, different LLR values may be assigned to these two memory cell transistors MT depending on their location in the memory cell array 11.

Next, as shown in FIG. 10, the memory controller 20 performs soft bit decoding (S6). The memory controller 20 inputs the soft-bit data {HB, SB1-SB5} generated in step S4 and the LLR table 273A set in step S5 to the ECC circuit 24. The ECC circuit 24 performs soft bit decoding using the soft-bit data {HB, SB1-SB5} and the LLR values extracted from the LLR table 273A. As above, the soft bit decoding process is finished.

1.2.1 Generation of Soft-Bit Data

Figure 14:
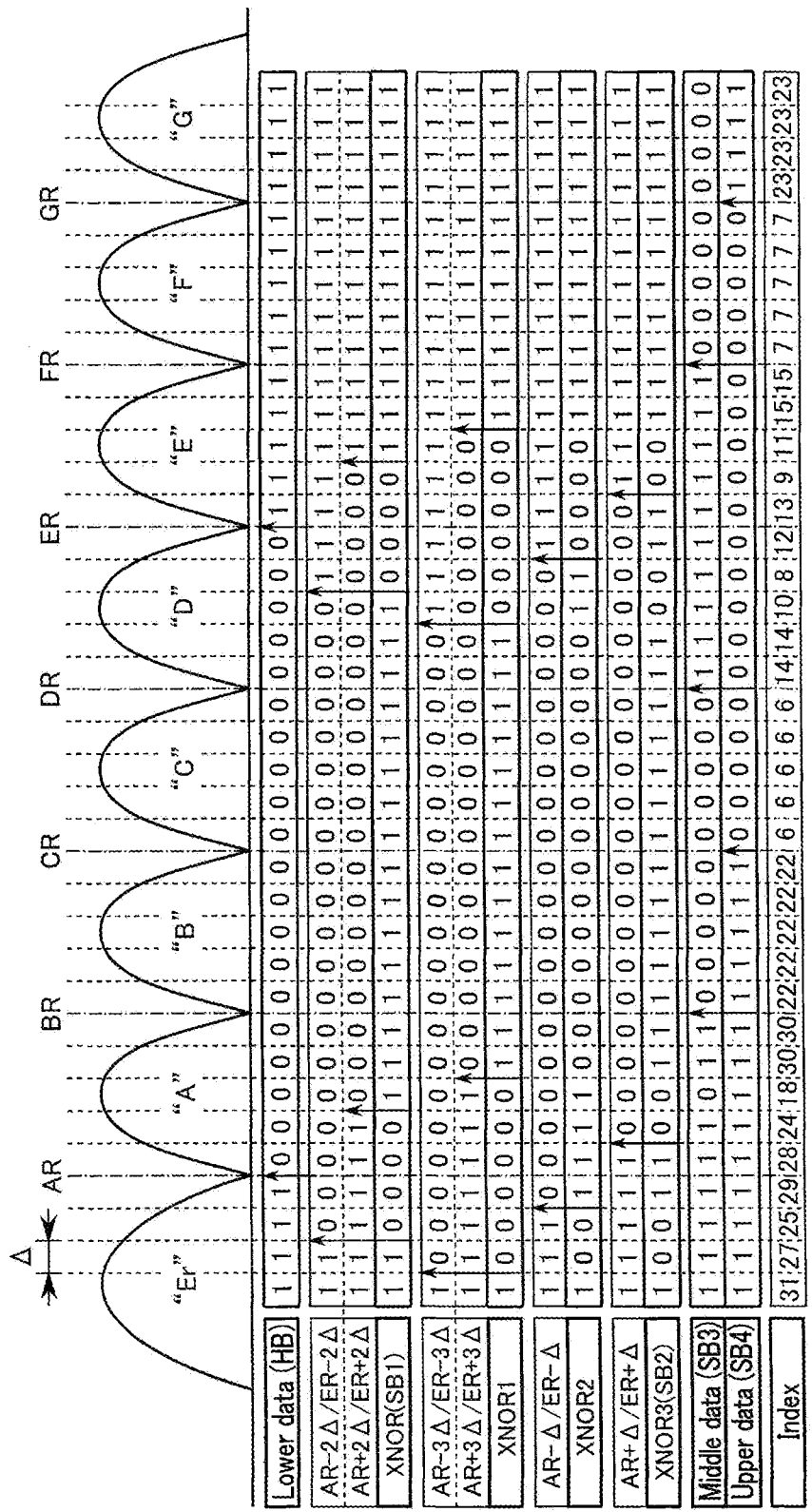
FIG. 14 is a diagram showing examples of hard-bit data, soft-bit data, and indices in a case where a lower page is a read target according to the first embodiment.

The generation of the soft-bit data {HB, SB1-SB4} in the above-described step S2 will be described below. FIG. 14 is a diagram showing examples of the hard-bit data HB, the soft-bit data SB1, the soft-bit data SB2, the soft-bit data SB3, the soft-bit data SB4, and indices in a case where the lower page is a read target. The read voltages AR, BR, CR, DR, ER, FR, and GR correspond to, for example, the smallest voltages estimated through the Vth tracking in step S1 in FIG. 10.

As indicated in the first row, the hard-bit data HB in the lower page has data "1" for the memory cell transistors MT having threshold voltages lower than the voltage AR or equal to or higher than the voltage ER, and has data "0" for the memory cell transistors MT having threshold voltages equal to or higher than the voltage AR and lower than the voltage ER.

To acquire the soft-bit data SB1, the memory controller 20 first acquires data read at a voltage that is lower by a certain level than the voltage AR, and a voltage that is lower by a certain level than the voltage ER. A difference between the voltage to be used for reading at this time and each of the voltages AR and ER is, for example, −2Δ. That is, the memory controller 20 uses, in place of the voltages AR and ER, voltages AR−2Δ and ER−2Δ, respectively, as read voltages, and stores a result of the lower page reading in any one of the data latches DL. Here, Δ may be set to any magnitude. The value Δ may be equal to an integral multiple of a predetermined resolution of the read voltage VCGRV that can be instructed to the semiconductor memory device 10 (e.g., a minimum magnitude of the read voltage VCGRV that can be increased or decreased).

Upon receipt of a data reading instruction, the semiconductor memory device 10 performs the data reading as instructed. The result of the lower page reading with the voltages AR−2Δ and voltage ER−2Δ is described in the second row of the chart. The data read from the memory cell transistors MT having threshold voltages lower than the voltage AR−2Δ or equal to or higher than the voltage SR−2Δ exhibit data "1". The data read from to the memory cell transistors MT having threshold voltages equal to or higher than the voltage AR−2Δ and lower than the voltage ER−2Δ exhibit data "0". Hereinafter, data read into the data latch by the lower page reading using a difference M (e.g., −2Δ) will be referred to as "M lower page data". The −2Δ lower page data is stored in a data latch (e.g., the data latch DL0) of the semiconductor memory device 10.

In a manner similar to the above, the memory controller 20 instructs the semiconductor memory device 10 to perform the lower page reading using voltages AR+2Δ and ER+2Δ as the read voltages, in place of the voltages AR and ER, respectively. The result of the reading is stored in another data latch set (e.g., the data latch XDL) of the semiconductor memory device 10.

Next, the memory controller 20 instructs the semiconductor memory device 10 to execute an exclusive NOR (also referred to as "XNOR") operation on the data in the data latch DL0 and the data in the data latch XDL. Upon receipt of the operation instruction, the semiconductor memory device 10 executes the XNOR operation on the data in the data latch DL0 and the data in the data latch XDL. Specifically, the sequencer 16 uses, as an input, two bits at the same position (i.e., the same bit line BL) in the data of the data latch DL0 and the data of the data latch XDL to execute the XNOR operation on the two input bits using the logic circuit LC. The sequencer 16 executes such an operation on all of the bits of the data in the data latch DL0 and the data latch XDL.

The results of the operations are stored in the data latch (e.g., the data latch XDL). More specifically, the sequencer 16 executes the XNOR operation on the data in the data latch circuit DLC0 and on the data in the data latch circuit XDLC coupled to that data latch circuit DLC0, using the logic circuit LC coupled to these data latch circuits DLC0 and XDLC. The result of the operation is stored in the data latch circuit XDLC that is coupled to the logic circuit LC. The data thereby stored in the data latch circuit XDLC is a soft bit of the soft-bit data SB1. The data thereby stored in the data latch XDL is the soft-bit data SB1. Thereafter, the soft-bit data SB1 is transmitted to the memory controller 20, where it is stored in the data storage part 271.

In a manner similar to the above, the soft-bit data SB2 is acquired through reading data from a selected page into a data latch XDL and through a logical operation. First, a result of an XNOR operation executed on −3Δ lower page data and +3Δ lower page data is acquired (i.e., XNOR1 data). Next, a result of an XNOR operation executed on the XNOR1 data and −Δ lower page data is acquired (i.e., XNOR2 data). Then, a result of an XNOR operation executed on the XNOR2 data and +Δ lower page data is acquired (i.e., XNOR3 data). The XNOR3 data, which is the soft-bit data SB2, is transmitted to the memory controller 20 and stored in the data storage part 271.

The memory controller 20 further instructs the semiconductor memory device 10 to read data in the middle page and the upper page from the selected cell unit CU to acquire the middle page data and the upper page data. The middle page data is dealt with as the soft-bit data SB3, and the upper page data is dealt with as the soft-bit data SB4.

Of the hard-bit data HB and various soft-bit data SB1 to SB4, a set of bits obtained as a result of data reading from the same selected transistor MT forms one index. The number of bits in a set that constitute one index depends on the method of error correction by the ECC circuit 24. The number of bits does not restrict the embodiment. In the example of the present embodiment, a set of five bits of the data of the hard-bit data HB and soft-bit data SB1 to SB4 that is read from the same selected cell transistor MT forms one index. Each index has a unique value for a combination of the five bits. In the drawing, these indices are expressed in decimal digits.

In the above, the example in which the soft-bit data SB1 to SB4 are generated by the sense amplifier 29 has been described, but the soft-bit data SB1 to SB4 may be generated by the memory controller 20, in particular, the control part 27.

1.3 Effect of First Embodiment

According to the memory system 1 of the first embodiment, a correction capability of soft bit decoding can be improved. Thereby, reliability of the error correction processing in the memory system 1 can be improved.

An effect of the first embodiment will be described below.

The semiconductor memory device may have different electrical characteristics depending on locations where the memory cell transistors MT are arranged. A threshold voltage characteristic of a memory cell transistor MT differs depending on whether the memory cell translator MT is the outer cell or the inner cell.

In the first embodiment, the memory controller 20 generates the outer-bit determination data SB5 to determine an outer cell and an inner cell. By using the outer-bit determination data SB5, the memory controller 20 sets LLR values respectively corresponding to, or in response to, the outer cell and the inner cell. That is, for soft-bit data {HB, SB1-SB4} read from memory cell transistors MT belonging to the outer cells (e.g., the cell of IO3 or IO7 of the string unit SU0), the memory controller 20 sets LLR values which are suitable for the outer cells. On the other hand, for soft-bit data {HB, SB1-SB4} read from memory cell transistors MT belonging to the inner cells (e.g., the cell of IO0, IO1, IO2, IO4, IO5, or IO6 of the string unit SU0), the memory controller 20 sets LLR values which are suitable for the inner cells. Thereby, a correction capability of soft bit decoding using the LLR values can be improved. As a result, the reliability of the error correction processing in the memory system 1 can be improved.

2. Second Embodiment

Soft bit decoding in a memory system according to a second embodiment will be described below. In the first embodiment, the case in which the ECC circuit 24 can accept soft-bit data having a 6-bit width (i.e., an index having 6 bit width per one memory cell transistor MT) has seen described, but in the second embodiment, a case in which a bit width of data that can be input to the ECC circuit 24 is restricted will be described. Herein, a case is described in which a bit width of the soft-bit data that can be input is 5 bits (i.e., an index having 5-bit width per one memory cell transistor MT). In the description of the second embodiment, differences from the first embodiment will be mainly described. The other configurations and operations that are not described are the same as those of the first embodiment.

2.1. Configuration of ECC Circuit

Next, the ECC circuit 24 in the memory controller 20 in the second embodiment will be described.

FIG. 15 is a diagram showing a functional block relating to the ECC circuit 24 in the memory controller 20. The memory controller 20 includes the control part 27. The control part 27 is realised by a combination of some of the functions of the CPU 21, RAM 22, and ROM 23.

The control part 27 controls processing relating to the operation of the ECC circuit 24. The control part 27 includes the data storage part 271 and the LLR setting part 273, and further includes a data converter 274 instead of the data generator 272.

The data storage part 271 is, for example, realized by the function of the RAM 22, and stores the hard-bit data HB, the soft-bit data SB1 to SB4, and the outer-bit determination data SB5.

The data converter 274 couples the soft-bit data {HB, SB1-SB4} and the outer-bit determination data SB5 to generate the soft-bit data {HB, SB1-SB5}. The data converter 274 stores a conversion table 274A used for converting the soft-bit data {HB, SB1-SB5}. With the conversion table 274A, indices for converting the soft-bit data {HB, SB1-SB5} to converted soft-bit data {HB, SB1-SB4} are associated. The conversion table 274A may be stored in the memory system 1 in advance, for example, prior to the shipment of the memory system 1 from the factory. Alternatively, the conversion table 274A may be generated by the control part 27 prior to converting the soft-bit data {HB, SB1-SB5}.

The LLR setting part 273 may store an LLR table 273B used for soft bit decoding. In the LLR table 273B, indices corresponding to the converted soft-bit data {HB, SB1-SB4} and LLR values corresponding to the indices are associated. The conversion from the indices to the LLR values can be performed using the LLR table 273B. The LLR table 273B may be stored in the memory system 1 in advance, for example, prior to the shipment of the memory system 1 from the factory. Alternatively, the LLR table 273B may be generated by the control part 27 prior to performing the conversion to LLR values.

The ECC circuit 24 includes the error correction circuit 241. The error correction circuit 241 receives the converted soft-bit data {HB, SB1-SB4} and the LLR table 273B from the control part 27, and performs soft bit decoding. The error correction circuit 241 may perform decoding per data having a size, for example, of a frame.

2.2 Operation of Second Embodiment

In the following, soft bit decoding in error correction processing in data reading performed in the memory system 1 will be described.

Figure 16:
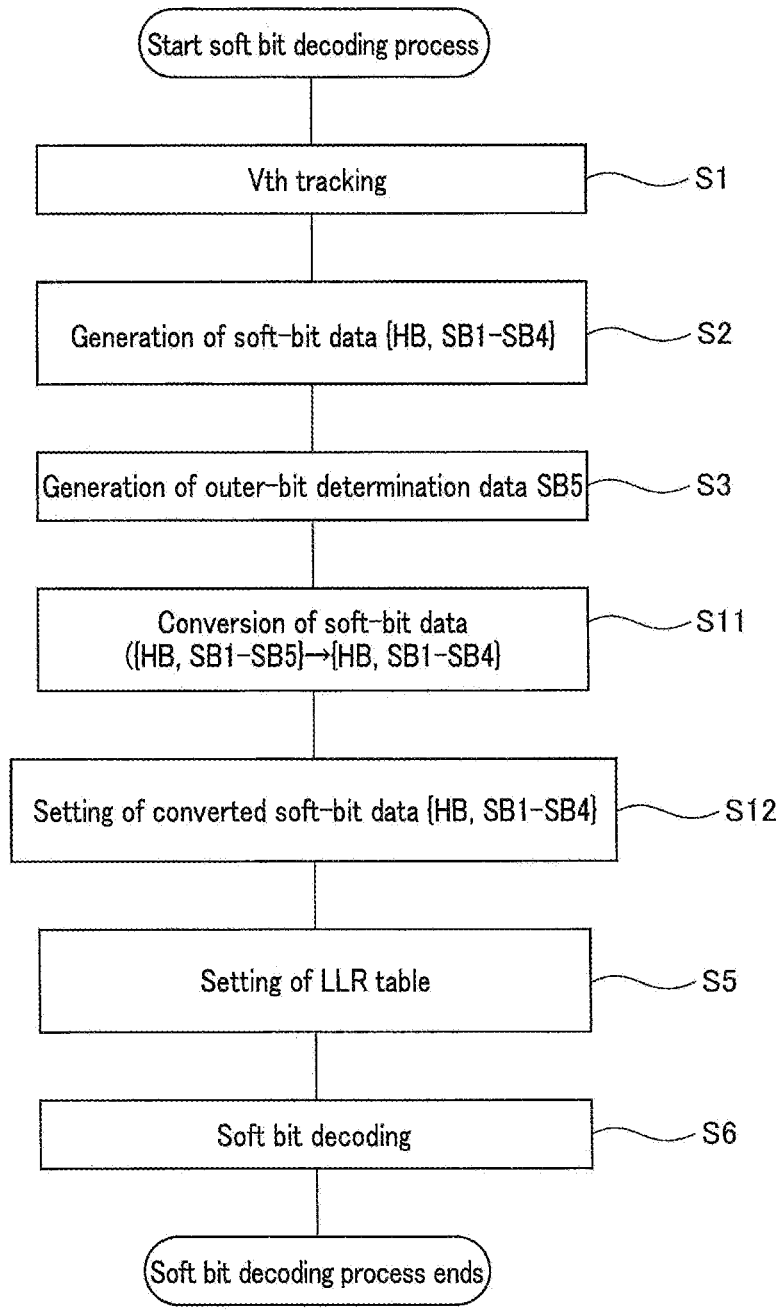
FIG. 16 is a flowchart showing processing of soft bit decoding in a memory system according to the second embodiment.

FIG. 16 is a flowchart showing processing of soft bit decoding in the memory system 1 of the second embodiment. The processing described below is instructed or executed by the memory controller 20.

First, the memory controller 20 performs Vth tracking as shown in FIG. 16 (S1). In the Vth tracking, the memory controller 20 estimates optimal read voltages ARop, BRop, CRop, DRop, ERop, FRop, and (or) GRop.

Next, the memory controller 20 performs generation of the soft-bit data {HB, SB1-SB4} (S2). That is, the memory controller 20 reads, for example, the hard-bit data HB from the semiconductor memory device 10. Further, the memory controller 20 reads the soft-bit data SB1 to SB4 from the semiconductor memory device 10. Then, the soft-bit data {HB, SB1-SB4} is stored in the data storage part 271.

Next, the memory controller 20 performs generation of the outer-bit determination data SB5 (S3). The memory controller 20 generates the outer-bit determination data SB5 as shown in FIG. 12 depending on whether a memory cell transistor MT is the outer cell or the inner cell. The generated outer-bit determination data SB5 is stored in the data storage part 271.

Next, as shown in FIG. 16, the memory controller 20 generates the soft-bit data {HB, SB1-SB5} including the outer-bit determination data SB5, and converts the soft-bit data {HB, SB1-SB5} to the converted soft-bit data {HB, SB1-SB4} using the conversion table 274A (S11). That is, the memory controller 20 couples the soft-bit data {HB, SB1-SB4} generated in step S2 and the outer-bit determination data SB5 generated in step S3 to generate the soft-bit data {HB, SB1-SB5}. Next, the memory controller 20 converts the soft-bit data {HB, SB1-SB5} having 6-bit width indices to the converted soft-bit data {HB, SB1-SB4} having 5-bit width indices using the conversion table 274A.

FIG. 17 is a diagram showing an example of the conversion table 274A used for converting the soft-bit data {HB, SB1-SB5} to the converted soft-bit data {HB, SB1-SB4}. In this drawing, indices of the soft-bit data {HB, SB1-SB5} as input data and indices of the converted soft-bit data {HB, SB1-SB4} as output data after conversion are respectively indicated.

The conversion using the conversion table 274A is performed, for example, in the following manner. Input data of indices 0 to 25 become output data of indices 0 to 25 as they are. Input data of indices 26 to 31 are converted to become output data of indices 0 to 5. Input data of indices 32 to 51 are converted to become output data of indices 0 to 19. Input data of indices 52 to 57 are converted to become output data of indices 26 to 31. Further, input data of indices 58 to 63 are converted to become output data of indices 0 to 5.

Indices labeled with "Common to inner/outer bits" (i.e., indices 0 to 19 of the converted soft-bit data {HB, SB1-SB4}) in FIG. 17 may be used in soft bit decoding for data read from the inner bits or the outer bits. Indices labeled with "Inner bits" (i.e., indices 20 to 25 of the converted soft-bit data {HB, SB1-SB4}) in FIG. 17 may be used in soft bit decoding for the inner bits only. Indices labeled with "outer bits" (i.e., indices 26 to 31 of the converted soft-bit data {HB, SB1-SB4}) in FIG. 17 may be used in soft bit decoding for the outer bits only.

The relationships between the input index and the output index (i.e., converted index) may be determined through a performance test of the ECC circuit 24. Such a performance test may be done in simulation or in evaluation of the memory system 1 before its shipment. For example, indices labeled with "Common to inner/outer bits" are determined when the LLR values associated therewith are suitable commonly for both the inner bits and the outer bits. Further, indices labeled with "Inner bits" are determined when the LLR values associated therewith are suitable for the inner bits but not suitable for the outer bits. Further, indices labeled with "Outer bits" are determined when the LLR values associated therewith are suitable for the outer bits but not suitable for the inner bits.

Through such conversions, all the input data of the indices 0 to 63 are converted to the output data of the indices 0 to 31. Then, the output data of the indices 0 to 31, i.e., the converted soft-bit data {HB, SB1-SB4}, is set as data for determining the outer bit and the inner bit (S12).

Next, the memory controller 20 sets the LLR table 273B in the LLR setting part 273 as shown in FIG. 16 (S5). The LLR table 273R is used for soft bit decoding in the next step S6. The LLR table 273B sections LLR values of the outer bits and the inner bits.

FIG. 16 is a diagram showing an example of the LLR table 273B used for soft bit decoding. In the LLR table 273B, the indices 0 to 31 that have been converted using the conversion table 274A to the converted soft-bit data {HB, SB1-SB4} and LLR values are associated. LLR values of the indices 0 to 19 are common LLR values that are valid for the inner bits and the outer bits. LLR values of the indices 20 to 25 are LLR values that are valid for the inner bits. Furthermore, LLR values of the indices 26 to 31 are LLR values that are valid for the outer bits. By using the LLR table 273B, it is possible to obtain LLR values according to characteristics of respective threshold voltage distributions of the outer bits and the inner bits.

Next, as shown in FIG. 16, the memory controller 20 performs soft bit decoding (S6). The memory controller 20 inputs the converted soft-bit data {HB, SB1-SB4} set in step S12 and the LLR table 273B set in step S5 to the ECC circuit 24. The ECC circuit 24 performs soft bit decoding using the converted soft-bit data {HB, SB1-SB4} and the LLR values extracted from the LLR table 273B. As above, the soft bit decoding process is finished.

2.3 Effect of Second Embodiment

According to the memory system 1 of the second embodiment, a correction capability of soft bit decoding can be improved in the same manner as in the first embodiment. Thereby, the reliability of the error correction processing in the memory system 1 can be improved.

Furthermore, in the second embodiment, even in a case where a bit width of data that can be input to the ECC circuit 24 is restricted, a similar effect to that of the first embodiment can be obtained by converting the soft-bit data to the number of bits that can be input.

3. Third Embodiment

Soft bit decoding in a memory system according to a third embodiment will be described below. In the first embodiment, LLR values respectively corresponding to the outer bits and the inner bits are set after reading the soft-bit data, but in the third embodiment, soft-bit data are read based on read voltages which are respectively suitable for outer bits and inner bits, and LLR values respectively corresponding to the outer bits and the inner bits are set. Hereinafter, the road voltages suitable for the outer bits will be referred to as outer-suitable read voltages. Further, the read voltages suitable for the inner bits will be referred to as inner-suitable read voltages. In the description of the third embodiment, differences from the first embodiment will be mainly described. The other configurations and operations that are not described are the same as those of the first embodiment.

3.1. Configuration of ECC Circuit

Next, the ECC circuit 24 in the memory controller 20 in the third embodiment will be described.

FIG. 19 is a diagram showing a functional block relating to the ECC circuit 24 in the memory controller 20. The memory controller 20 includes the control part 27. The control part 27 is realized by a combination of some of the functions of the CPU 21, RAM 22, and ROM 23.

The control part 27 controls processing relating to the operation of the ECC circuit 24. The control part 27 includes the data storage part 271, the data generator 272, and the LLR setting part 273.

The data storage part 271 is, for example, realized by the function of the RAM 22, and stores hard-bit data HB, soft-bit data SB1 to SB4, and outer-bit determination data SB5 obtained based on the inner-suitable read voltages, and hard-bit data HB, soft-bit data SB1 to SB4, and outer-bit determination data SB5 obtained based on the inner-suitable read voltages.

The data generator 272 synthesizes inner soft-bit data {HB, SB1-SB5} obtained based on the inner-suitable read voltages and outer soft-bit data {HB, SB1-SB5} obtained based on the outer-suitable read voltages to generate synthesized soft-bit data {HB, SB1-SB5}.

The LLR setting part 273 may store an LLR table 273C used for soft bit decoding. In the LLR table 273C, indices corresponding to the synthesized soft-bit data {HB, SB1-SB5}, and LLR values corresponding to indices, are associated. The conversion from the indices to the LLR values can be performed using the LLR table 273C. The LLR table 273C may be stored in the memory system 1 in advance, for example, prior to the shipment of the memory system 1 from the factory. Alternatively, the LLR table 273C may be generated by the control part 27 prior to performing the conversion to LLR values.

The ECC circuit 24 includes the error correction circuit 241. The error correction circuit 241 receives the synthesized soft-bit data {HB, SB1-SB5} and the LLR table 273C from the control part 27, and performs soft bit decoding. The error correction circuit 241 may perform decoding per data having a size, for example, of a frame.

3.2 Operation of Third Embodiment

In the following, soft bit decoding in error correction processing in data reading performed in the memory system 1 will be described.

FIG. 20 is a flowchart showing processing of soft bit decoding performed in the memory system 1 of the third embodiment. The processing described below is instructed or executed by the memory controller 20.

First, the memory controller 20 performs Vth tracking on memory cell transistors MT suitable for inner bits as shown in FIG. 20 (S31). In the Vth tracking, the memory controller 20 estimates an optimal read voltage VCGRVop suitable for the inner bits (i.e., estimates the inner-suitable read voltages).

Next, the memory controller 20 performs generation of the outer-bit determination data SB5 (S32). The memory controller 20 generates the outer-bit determination data SB5 as shown in FIG. 12 depending on whether the memory cell transistor MT is the outer cell or the inner cell. The generated outer-bit determination data SB5 is stored in the data storage part 271.

Next, the memory controller 20 performs generation of the inner soft-bit data {HB, SB1-SB5} based on the inner-suitable read voltages (S33). That is, the memory controller 20, for example, reads hard-bit data HB from the semiconductor memory device 10 using the optimal read voltage VCGRVop suitable for the inner bits obtained in step S31. Furthermore, the memory controller 20 reads the soft-bit data SB1 to SB4 from the semiconductor memory device 10 using a voltage generated based on the optimal read voltage VCGRVop suitable for the inner bits. Then, the memory controller 20 couples the generated soft-bit data {HB, SB1-SB4} and the outer-bit determination data SB5 to generate the inner soft-bit data {HB, SB1-SB5}. The generated inner soft-bit data {HB, SB1-SB5} is stored in the data storage part 271.

Section (a) in FIG. 21 is a diagram showing an example of the inner soft-bit data {HB, SB1-SB5}. As described above, one cell unit CU includes 4584*8=36672 memory cell transistors MT. In the drawing, the "Cell ID" (0 to 36671) is an identifier of the 36672 memory cell transistors MT. The "index" indicates {soft bits in SB5 to SB1, hard bit in HB} obtained from the memory cell transistor MT using the inner-suitable read voltage(s) and is expressed in a decimal digit. The "Inner/Outer" indicates whether the memory cell transistor MT is an inner bit or an outer bit. The indices surrounded by broken lines in the section (a) in FIG. 21 are obtained from memory cell transistors MT corresponding to the inner bits using the inner-suitable read voltages. The indices not surrounded by broken lines in the section (a) in FIG. 21 are obtained from memory cell transistors MT corresponding to the outer bits using the inner-suitable read voltages. For example, from the memory cell transistor MT having Cell ID 0 which is an inner bit, index 31 is obtained. Further, from the memory cell transistor MT having Cell ID 3 which is an outer bit, index 52 is obtained.

Next, as shown in FIG. 20, the memory controller 20 performs Vth tracking on memory cell transistors MT suitable for outer bits (S34). In the Vth tracking, the memory controller 20 estimates an optical read voltage VCGRVop suitable for the outer bits (i.e., estimates the outer-suitable read voltages).

Next, the memory controller 20 performs generation of the outer soft-bit data {HB, SB1-SB5} based on the outer-suitable read voltages (S35). That is, the memory controller 20, for example, reads hard-bit data HB from the semiconductor memory device 10 using the optimal read voltage VCGRVop suitable for the outer bits obtained in step S34. Furthermore, the memory controller 20 reads soft-bit data SB1 to SB4 from the semiconductor memory device 10 using a voltage generated based on the optimal read voltage VCGRVop suitable for the outer bits. Then, the memory controller 20 couples the generated soft-bit data {HB, SB1-SB4} and the outer-bit determination data SB5 to generate the outer soft-bit data {HB, SB1-SB5}. The generated outer soft-bit data {HB, SB1-SB5} is stored in the data storage part 271.

Section (b) in FIG. 21 is a diagram showing an example of the inner soft-bit data {HB, SB1-SB5}. The "index" indicates {soft bits in SB5 to SB1, hard bit in HB} obtained from the memory cell transistor MT using the outer-suitable read voltages. The indices surrounded by broken lines in the section (b) in FIG. 21 are obtained from memory cell transistors MT corresponding to the outer bits using the outer-suitable read voltages. The indices not surrounded by broken lines in the section (b) in FIG. 21 are obtained from memory cell transistors MT corresponding to the inner bits using the outer-suitable read voltages. For example, from the memory cell transistor MT having Cell ID 0 which is an inner bit, index 20 is obtained. Further, from the memory cell transistor MT having Cell ID 3 which is an outer bit, index 38 is obtained.

Next, as shown in FIG. 20, the memory controller 20 uses the data generator 272 to synthesize the inner soft-bit data {HB, SB1-SB5} and the outer soft-bit data {HB, SB1-SB5} (S36). Then, the memory controller 20 sets the synthesized soft-bit data {HB, SB1-SB5} in the data generator 272 (S37).

Section (c) in FIG. 21 is a diagram showing an example of the synthesized soft-bit data {HB, SB1-SB5} obtained by synthesizing the inner soft-bit data {HB, SB1-SB5} and the outer soft-bit data {HB, SB1-SB5}. The indices surrounded by broken lines in the section (c) in FIG. 21 are the indices surrounded by broken lines in the section (a) in FIG. 21 or the indices surrounded by broken lines in the section (b) in FIG. 21.

Next, as shown in FIG. 20, the memory controller 20 sets the LLR table 273C in the LLR setting part 273 (S38). The LLR table 273C is used for soft bit decoding in the next step S39. The LLR table 273C sections LLR values of the outer bits and the inner bits.

Figure 22:
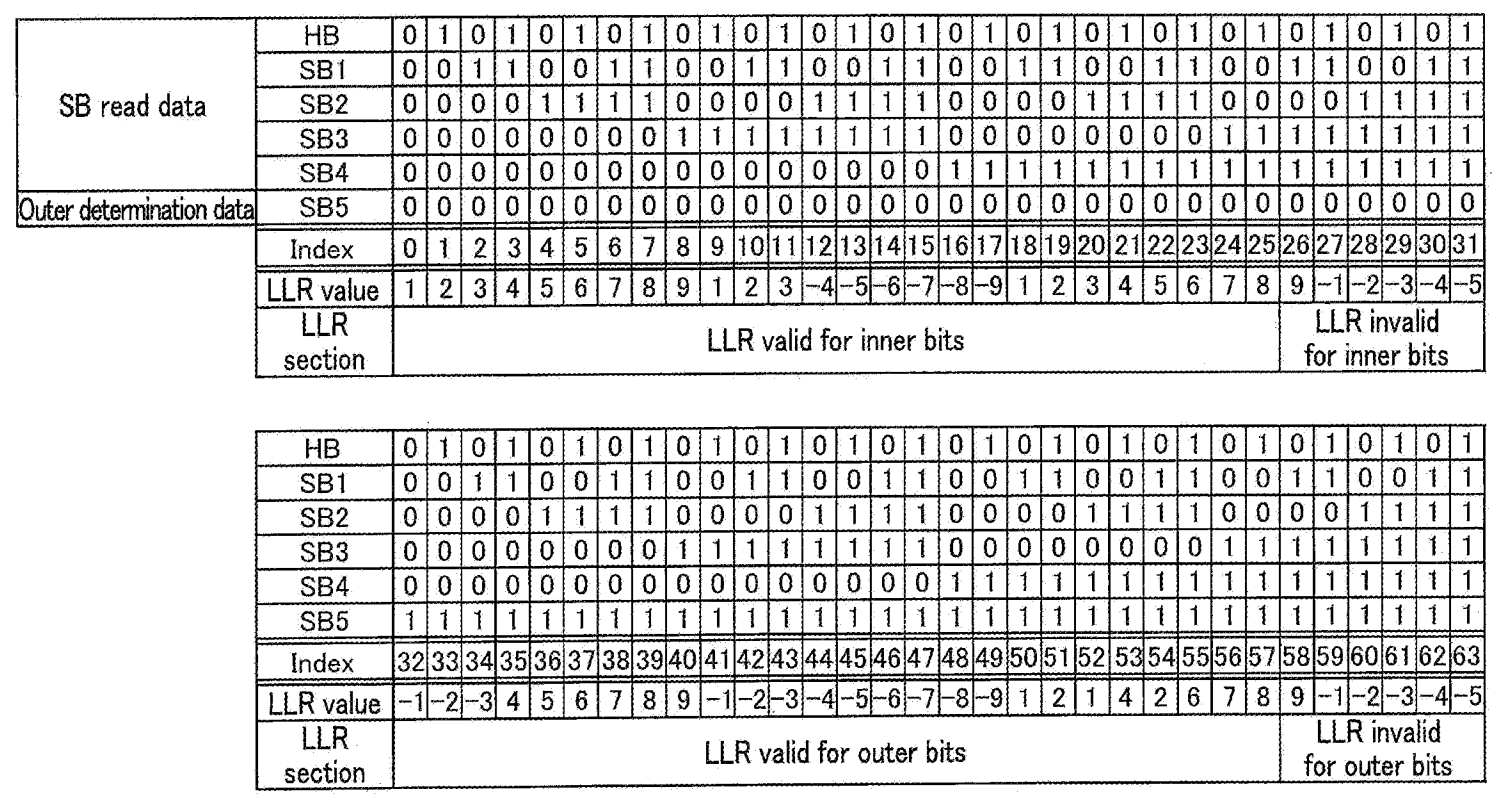

FIG. 22 is a diagram showing an example of the LLR table 273C used for soft bit decoding. In the LLR table 273C, indices obtained from the soft-bit data {HB, SB1-SB5} set in step S37 and the LLR values are associated. LLR values of indices 0 to 25 are LLR values that are valid for the inner bits. LLR values of indices 26 to 31 are LLR values chat are invalid for the inner bits. Furthermore, LLR values of indices 32 to 57 are LLR values that are valid for the outer bits. LLR values of indices 58 to 63 are LLR values that are invalid for the outer bits.

By using the LLR table 273C, it is possible to obtain LLR values according to characteristics of respective threshold voltage distributions of the outer bits and the inner bits.

Next, as shown in FIG. 20, the memory controller 20 performs soft bit decoding (S39). The memory controller 20 inputs the synthesized soft-bit data {HB, SB1-SB5} set in step S37 and the LLR table 273C set in step S38 to the ECC circuit 24. The ECC circuit 24 performs soft bit decoding using the synthesized soft-bit data {HB, SB1-SB5} and the LLR values extracted from the LLR table 273C. As above, the soft bit decoding process is finished.

3.3 Effect of Third Embodiment

According to the memory system 1 of the third embodiment, a correction capability of soft bit decoding can be improved in the same manner as in the first embodiment. Thereby, the reliability of the error correction processing in the memory system 1 can be improved.

Furthermore, in the third embodiment, Vth tracking and soft-bit data reading are performed to find optimal read voltages suitable for outer bits and inner bits respectively. That is, the Vth tracking is performed on memory cell transistors MT, and soft-bit data are read based on an optimal read voltage VCGRVop suitable for the outer bits determined through this Vth tracking. Then, LLR values that are suitable for the outer bits are set. Similarly, the Vth tracking is performed on memory cell transistors MT, and soft-bit data are read based on an optimal read voltage VCGRVop suitable for the inner bits determined through this Vth tracking. Then, LLR values that are suitable for the inner bits are set. As such, the optimal read voltages VCGRVop respectively suitable for the outer bits and the inner bits are determined and the respective soft-bit data are read, thereby performing soft bit decoding with a higher accuracy.

4. Other Modifications

In the above-described embodiments, LLR values that respectively correspond to outer cells (or outer bits) and inner cells (or inner bits) are set and soft bit decoding is performed, but the threshold voltage characteristics of the memory cell transistor MT may also have a certain regularity depending on arrangement locations other than the outer cells or the inner cells. In such a case, an LLR value may be set according to characteristics of a memory cell transistor MT at that arrangement location. For example, the arrangement locations of the memory cell transistors MT may be sectioned by columns. Thus, depending on which column a memory cell transistor MT belongs to, an LLR value may be set according to that column.

Furthermore, the case in which a NAND flash memory is used as an example of a semiconductor memory device is described in the above embodiments. However, the embodiments are applicable to any other types of semiconductor memories in addition to the NAND flash memory, and are further applicable to various types of memory devices other than the semiconductor memories. In the flowcharts described in the above embodiments, the order of processing may be shuffled to the extent possible.

While certain embodiments of the present invention have been described, these embodiments have been presented by way of example only, and are not intended to limit the scope of the invention. These embodiments can be implemented in various other forms, and various omissions, replacements, and changes can be made without departing from the spirit of the invention. These embodiments and modifications thereof are included in the scope and gist of the invention as well as in the scope of the invention described in the claims and equivalents thereof.

What is claimed is:

1. A memory system comprising:
   a semiconductor memory device including a first memory cell arranged in a first region, and a second memory cell arranged in a second region; and
   a controller configured to control the semiconductor memory device, wherein the controller is configured to:
      obtain first data based on a first read operation performed on the first memory cell, and second data based on the first read operation performed on the second memory cell;
      obtain third data based on a second read operation performed on the first memory cell, and fourth data based on the second read operation performed on the second memory cell, the second read operation being different from the first read operation in a read voltage;
      set a first value indicating likelihood of data stored in the first memory cell based on first Information indicating that the first memory cell is arranged in the first region;
      in a case where the fourth data is equal to the third data, set a second value different from the first value, the second value indicating likelihood of data scored in the second memory cell based on second information indicating that the second memory cell is arranged in the second region; and
      perform error correction on data read from the first memory cell using at least the third data and the first value, and perform error correction on data read from the second memory cell using at least fourth data and the second value.

2. The memory system according to claim 1, wherein the semiconductor memory device includes:
   a semiconductor substrate;
   a first conductive layer arranged above the semiconductor substrate;
   a second conductive layer arranged above the first conductive layer;
   a first insulating layer arranged above the semiconductor substrate, extending in a first direction parallel to the semiconductor substrate, dividing the first conductive layer, and dividing the second conductive layer; and
   a second insulating layer arranged above the first conductive layer, extending in the first direction, not dividing the first conductive layer, and dividing the second conductive layer, wherein, in a second direction parallel to the semiconductor substrate and perpendicular to the first direction,
the first region and the second region are arranged between the first insulating layer and the second insulating layer, and
the second region is farther from the first insulating layer than the first region is.

3. The memory system according to claim 1, wherein the semiconductor memory device includes:
a semiconductor substrate;
a first conductive layer arranged above the semiconductor substrate;
a second conductive layer arranged above the first conductive layer;
a first insulating layer arranged above the semiconductor substrate, extending in a first direction parallel to the semiconductor substrate, dividing the first conductive layer, and dividing the second conductive layer;
a second insulating layer arranged above the first conductive layer, extending in the first direction, not dividing the first conductive layer, and dividing the second conductive layer; and
a first pillar and a second pillar that are provided above the semiconductor substrate and penetrate the first conductive layer and the second conductive layer,
wherein the first pillar includes the first memory cell, and the second pillar includes the second memory cell, and
in a second direction parallel to the semiconductor substrate and perpendicular to the first direction, the second pillar is farther from the first insulating layer than the first pillar is.

4. The memory system according to claim 3, wherein an intersecting portion of the first pillar and the first conductive layer corresponds to the first memory cell, and
an intersecting portion of the second pillar and the first conductive layer corresponds to the second memory cell.

5. The memory system according to claim 1, wherein the semiconductor memory device includes:
a semiconductor substrate;
a first conductive layer arranged above the semiconductor substrate;
a second conductive layer arranged above the first conductive layer;
a first insulating layer arranged above the semiconductor substrate, extending in a first direction and a second direction, and penetrating the first conductive layer and the second conductive layer, the first direction being parallel to the semiconductor substrate, the second direction being perpendicular to the semiconductor substrate;
a second insulating layer arranged above the first conductive layer, extending in the first direction, not penetrating the first conductive layer and penetrating the second conductive layer; and
a first pillar and a second pillar that are provided above the semiconductor substrate and penetrate the first conductive layer and the second conductive layer,
wherein the first pillar includes the first memory cell, and the second pillar includes the second memory cell, and
in a third direction parallel to the semiconductor substrate and perpendicular to the first direction, the second pillar is farther from the first insulating layer than the first pillar is.

6. The memory system according to claim 1, wherein the controller is further configured to:
perform multiple instances of first data reading on a plurality of memory cells that includes at least the first memory cell by changing a read voltage applied thereto;
based on the multiple instances of the first data reading, acquire a first read voltage corresponding to a minimum number of memory cells in a threshold voltage distribution of the plurality of memory cells; and
obtain the first data from the first memory cell using the first read voltage in the first read operation.

7. The memory system according to claim 6, wherein the plurality of memory cells further includes the second memory cell, and
the controller is configured to obtain the second data from the second memory cell using the first read voltage in the first read operation.

8. The memory system according to claim 6, wherein the plurality of memory cells further includes the second memory cell, and
the controller is further configured to:
perform multiple instances of second data reading on the plurality of memory cells by changing a read voltage applied thereto;
based on the multiple instances of the second data reading, acquire a second read voltage corresponding to a minimum number of memory cells in a threshold voltage distribution of the plurality of memory cells; and
obtain the second data from the second memory cell using the second read voltage in the first read operation.

9. The memory system according to claim 1, wherein the controller is configured to:
in the first read operation, perform reading on the first memory cell using a first read voltage;
in the second read operation, perform multiple instances of data reading on the first memory cell to obtain fifth data using a second read voltage and obtain sixth data using a third read voltage, the second read voltage being higher than the first read voltage, the third read voltage being lower than the first read voltage; and
obtain the third data by applying a logical operation on the fifth data and the sixth data.

10. The memory system according to claim 1, wherein the controller includes a memory configured to store the first value associated with the third data and the first information, and the second value associated with the fourth data and the second information.

11. A method of controlling a semiconductor memory device, the semiconductor memory device including a first memory cell arranged in a first region, and a second memory cell arranged in a second region, said method comprising:
obtaining first data based on a first read operation performed on the first memory cell, and second data based on the first read operation performed on the second memory cell;
obtaining third data based on a second read operation performed on the first memory cell, and fourth data based on the second read operation performed on the second memory cell, the second read operation being different from the first read operation in a read voltage;
setting a first value indicating likelihood of data stored in the first memory cell based on first information indicating that the first memory cell is arranged in the first region;

in a case where the fourth data is equal to the third data, setting a second value different from the first value, the second value indicating likelihood of data stored in the second memory cell based on second information indicating that the second memory cell is arranged in the second region; and performing error correction on data read from the first memory cell using at least the third data and the first value, and performing error correction on data read from the second memory cell using at least fourth data and the second value.

12. The method according to claim 11, wherein
the semiconductor memory device includes:
  a semiconductor substrate;
  a first conductive layer arranged above the semiconductor substrate;
  a second conductive layer arranged above the first conductive layer;
  a first insulating layer arranged above the semiconductor substrate, extending in a first direction parallel to the semiconductor substrate, dividing the first conductive layer, and dividing the second conductive layer; and
  a second insulating layer arranged above the first conductive layer, extending in the first direction, not dividing the first conductive layer, and dividing the second conductive layer,
wherein, in a second direction parallel to the semiconductor substrate and perpendicular to the first direction,
  the first region and the second region are arranged between the first insulating layer and the second insulating layer, and
  the second region is farther from the first insulating layer than the first region is.

13. The method according to claim 11, wherein
the semiconductor memory device includes:
  a semiconductor substrate;
  a first conductive layer arranged above the semiconductor substrate;
  a second conductive layer arranged above the first conductive layer;
  a first insulating layer arranged above the semiconductor substrate, extending in a first direction parallel to the semiconductor substrate, dividing the first conductive layer, and dividing the second conductive layer;
  a second insulating layer arranged above the first conductive layer, extending in the first direction, not dividing the first conductive layer, and dividing the second conductive layer; and
  a first pillar and a second pillar that are provided above the semiconductor substrate and penetrate the first conductive layer and the second conductive layer,
wherein the first pillar includes the first memory cell, and the second pillar includes the second memory cell, and
in a second direction parallel to the semiconductor substrate and perpendicular to the first direction, the second pillar is farther from the first insulating layer than the first pillar is.

14. The method according to claim 13, wherein
an intersecting portion of the first pillar and the first conductive layer corresponds to the first memory cell, and
an intersecting portion of the second pillar and the first conductive layer corresponds to the second memory cell.

15. The method according to claim 11, wherein
the semiconductor memory device includes:
  a semiconductor substrate;
  a first conductive layer arranged above the semiconductor substrate;
  a second conductive layer arranged above the first conductive layer;
  a first insulating layer arranged above the semiconductor substrate, extending in a first direction and a second direction, and penetrating the first conductive layer and the second conductive layer, the first direction being parallel to the semiconductor substrate, the second direction being perpendicular to the semiconductor substrate;
  a second insulating layer arranged above the first conductive layer, extending in the first direction, not penetrating the first conductive layer and penetrating the second conductive layer; and
  a first pillar and a second pillar that are provided above the semiconductor substrate and penetrate the first conductive layer and the second conductive layer,
wherein the first pillar includes the first memory cell, and the second pillar includes the second memory cell, and
in a third direction parallel to the semiconductor substrate and perpendicular to the first direction, the second pillar is farther from the first insulating layer than the first pillar is.

16. The method according to claim 11, further comprising:
performing multiple instances of first data reading on a plurality of memory cells that includes at least the first memory cell by changing a read voltage applied thereto;
based on the multiple instances of the first data reading, acquiring a first read voltage corresponding to a minimum number of memory cells in a threshold voltage distribution of the plurality of memory cells; and
obtaining the first data from the first memory cell using the first read voltage in the first read operation.

17. The method according to claim 16, wherein
the plurality of memory cells further includes the second memory cell, and
the method further comprises obtaining the second data from the second memory cell using the first read voltage in the first read operation.

18. The method according to claim 16, wherein
the plurality of memory cells further includes the second memory cell, and
the method further comprises:
  performing multiple instances of second data reading on the plurality of memory cells by changing a read voltage applied thereto;
  based on the multiple instances of the second data reading, acquiring a second read voltage corresponding to a minimum number of memory cells in a threshold voltage distribution of the plurality of memory cells; and
  obtaining the second data from the second memory cell using the second read voltage in the first read operation.

19. The method according to claim 11, further comprising:
in the first read operation, performing reading on the first memory cell using a first read voltage;
in the second read operation, performing multiple instances of data reading on the first memory cell to obtain fifth data using a second read voltage and obtain sixth data using a third read voltage, the second read voltage being higher than the first read voltage, the third read voltage being lower than the first read voltage; and obtaining the third data by applying a logical operation on the fifth data and the sixth data.

20. The method according to claim 11, wherein the semiconductor memory device includes a memory configured to store the first value associated with the third data and the first information, and the second value associated with the fourth data and the second information.

* * * * *